(12) United States Patent
Kamijo et al.

(10) Patent No.: US 10,091,877 B2
(45) Date of Patent: Oct. 2, 2018

(54) DISPLAY DEVICE AND INTER-SUBSTRATE CONDUCTING STRUCTURE

(71) Applicant: Japan Display Inc., Tokyo (JP)

(72) Inventors: Yoichi Kamijo, Tokyo (JP); Shuichi Osawa, Tokyo (JP); Yoshihiro Watanabe, Tokyo (JP); Yoshikatsu Imazeki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/661,862

(22) Filed: Jul. 27, 2017

(65) Prior Publication Data

US 2018/0035541 A1    Feb. 1, 2018

(30) Foreign Application Priority Data

Jul. 29, 2016    (JP) .................................. 2016-149612

(51) Int. Cl.
| | |
|---|---|
| *H05K 1/11* | (2006.01) |
| *H05K 1/14* | (2006.01) |
| *G02F 1/1345* | (2006.01) |
| *G02F 1/133* | (2006.01) |
| *G02F 1/1368* | (2006.01) |

(Continued)

(52) U.S. Cl.
CPC ........... *H05K 1/115* (2013.01); *G02F 1/1368* (2013.01); *G02F 1/13306* (2013.01); *G02F 1/13439* (2013.01); *G02F 1/13458* (2013.01); *G02F 1/133345* (2013.01); *G02F 1/134309* (2013.01); *G02F 1/136286* (2013.01); *H05K 1/144* (2013.01); *G02F 1/13338* (2013.01); *G02F 2201/121* (2013.01); *G02F 2201/123* (2013.01); *G02F 2201/124* (2013.01);

(Continued)

(58) Field of Classification Search
CPC ........... G02F 1/13306; G02F 1/133345; G02F 1/13338; G02F 1/134309; G02F 1/13439; G02F 1/13458; G02F 1/136286; G02F 1/1368; G02F 2201/121; G02F 2201/123; G02F 2201/124; G06F 3/0412; G06F 3/044
See application file for complete search history.

(56) References Cited

U.S. PATENT DOCUMENTS

| | | | | |
|---|---|---|---|---|
| 2010/0149477 A1* | 6/2010 | Nagami | ................ | G02F 1/1339 349/138 |
| 2014/0022478 A1* | 1/2014 | Kim | ..................... | G02F 1/1339 349/43 |

(Continued)

FOREIGN PATENT DOCUMENTS

JP    2009-237410 A    10/2009

*Primary Examiner* — Yuriy Semenenko
(74) *Attorney, Agent, or Firm* — K&L Gates LLP

(57) ABSTRACT

According to one embodiment, a display device includes a first substrate, a second substrate, and a connecting material. The first substrate includes a first basement and a first conductive layer. The second substrate includes a second basement and a second conductive layer. The first main surface is opposed to the first conductive layer and is spaced apart from one conductive layer. The second conductive layer provided on the second main surface has a first elongated protrusion. The connecting material comes into contact with the first elongated protrusion and the first conductive layer. The first elongated protrusion is disposed around the hole and surrounds the hole.

20 Claims, 15 Drawing Sheets

(51) Int. Cl.
*G02F 1/1362* (2006.01)
*G02F 1/1333* (2006.01)
*G02F 1/1343* (2006.01)
G06F 3/041 (2006.01)
G06F 3/044 (2006.01)

(52) U.S. Cl.
CPC ............ *G06F 3/044* (2013.01); *G06F 3/0412* (2013.01); *H05K 2201/10136* (2013.01)

(56) References Cited

U.S. PATENT DOCUMENTS

| | | | |
|---|---|---|---|
| 2016/0178943 A1* | 6/2016 | Hyodo | G02F 1/1339 349/43 |
| 2016/0293451 A1* | 10/2016 | Koelling | B22F 1/0014 |
| 2017/0269437 A1* | 9/2017 | Chen | G02F 1/134309 |

* cited by examiner

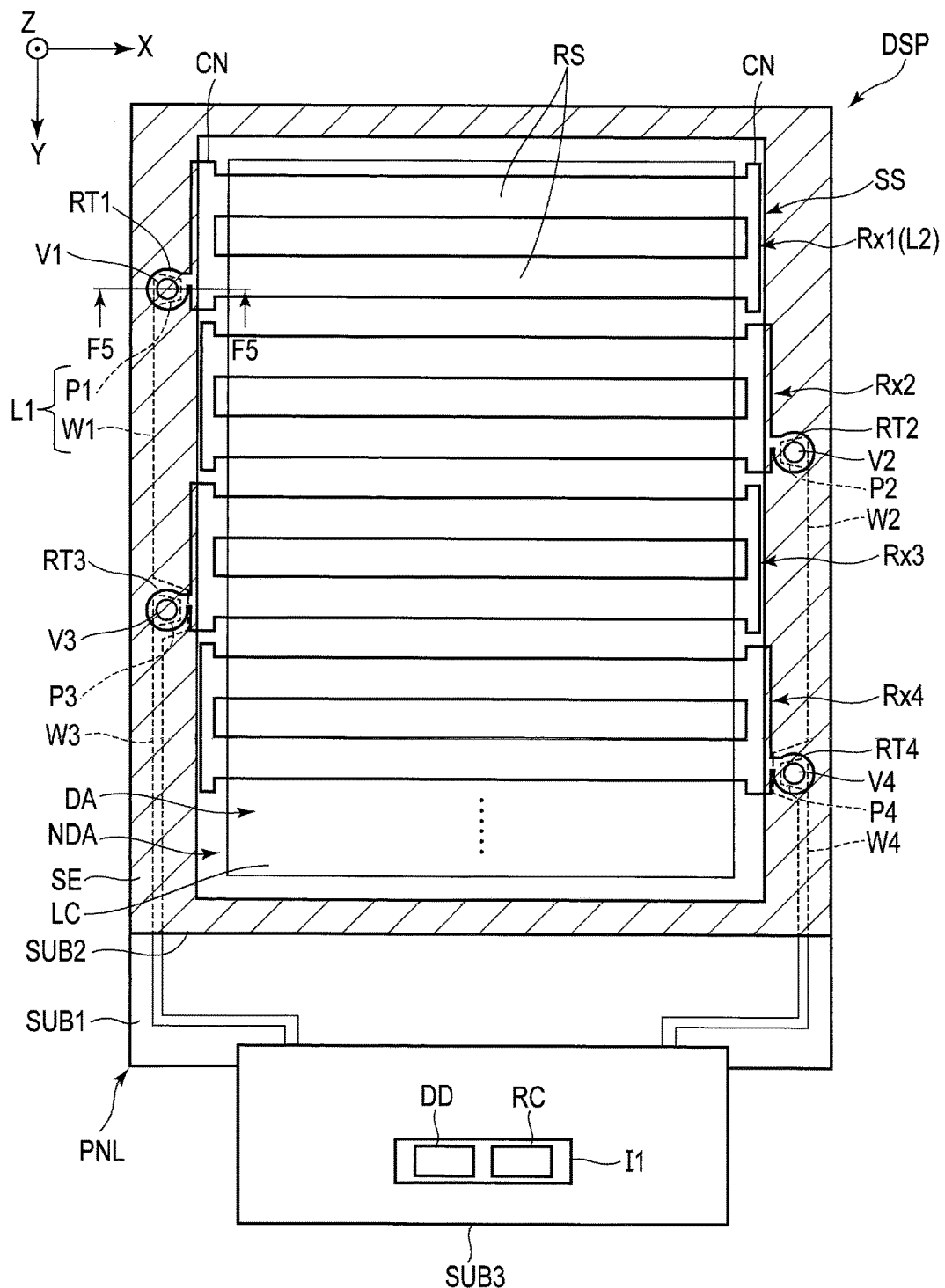
F I G. 1

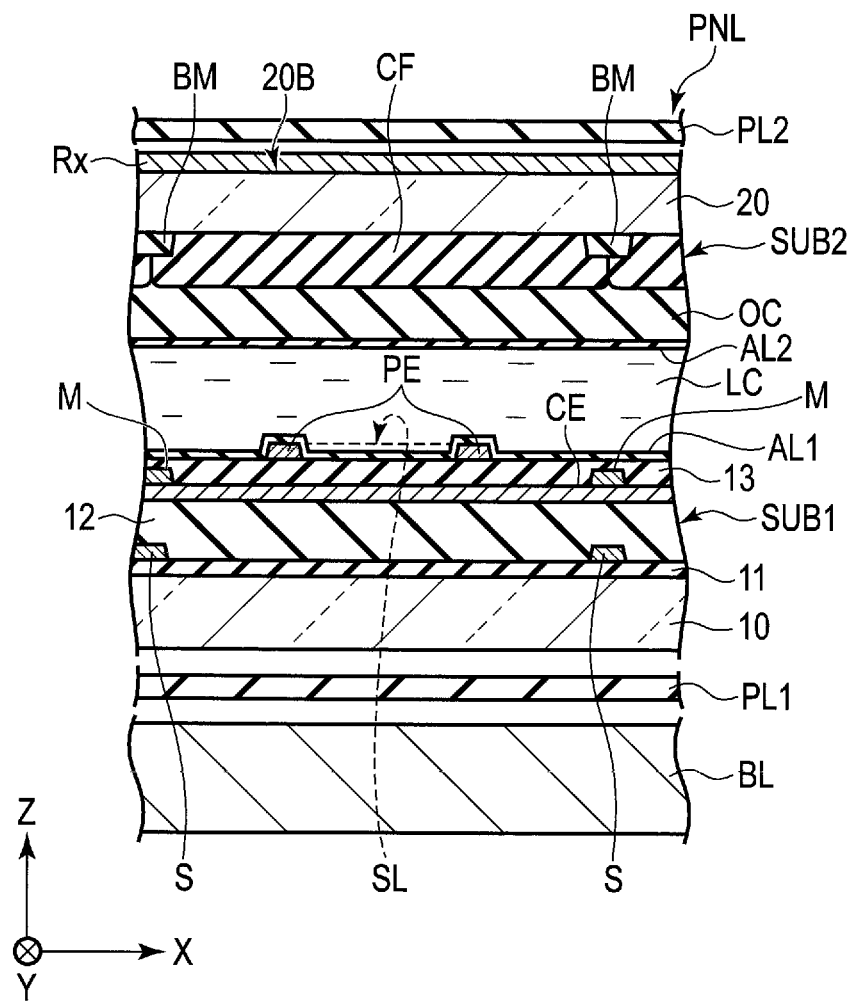
F I G. 3

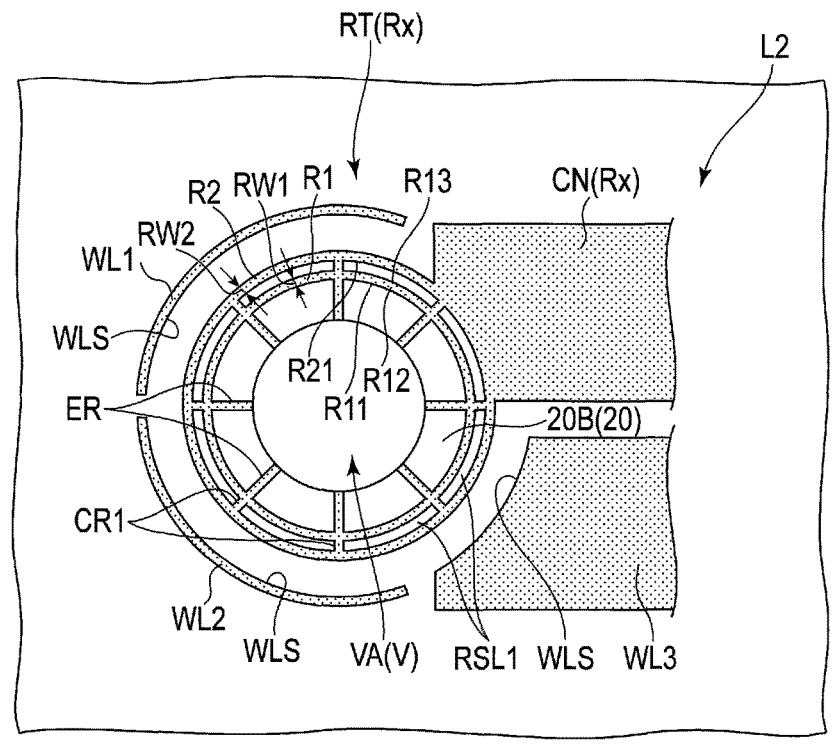
F I G. 6
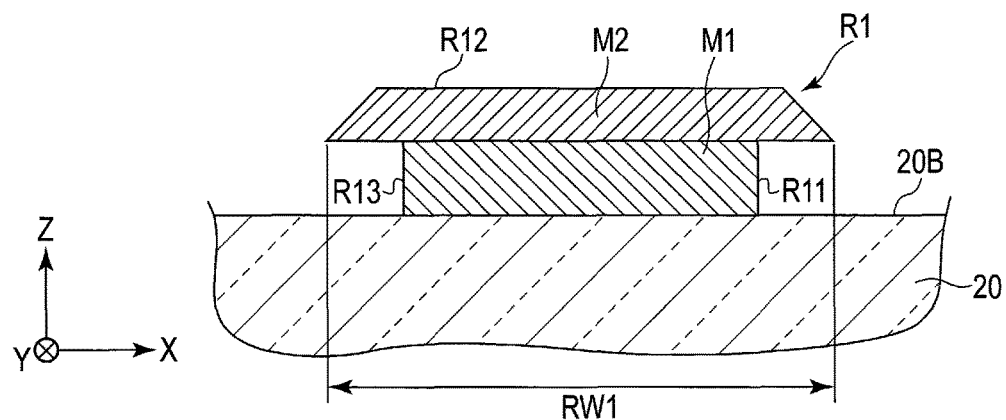
F I G. 7

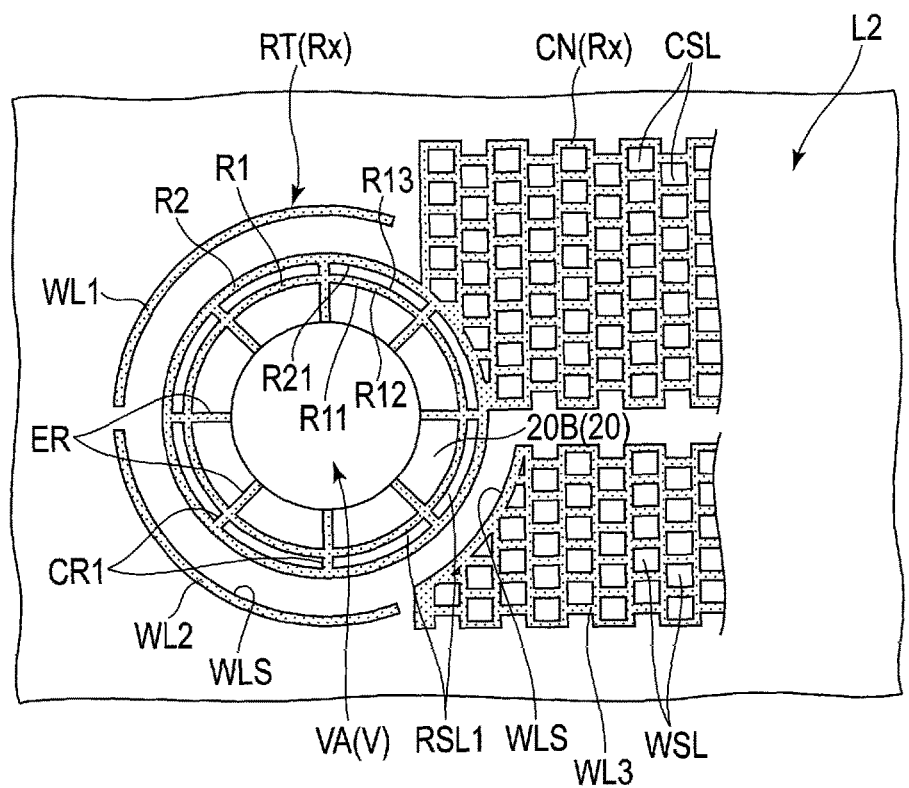
F I G. 10

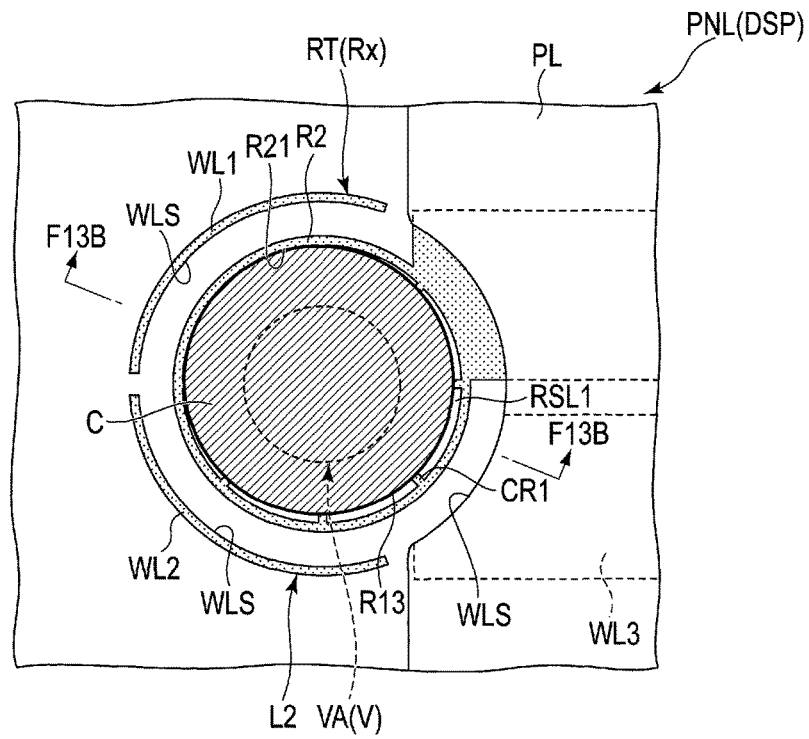
F I G. 13A
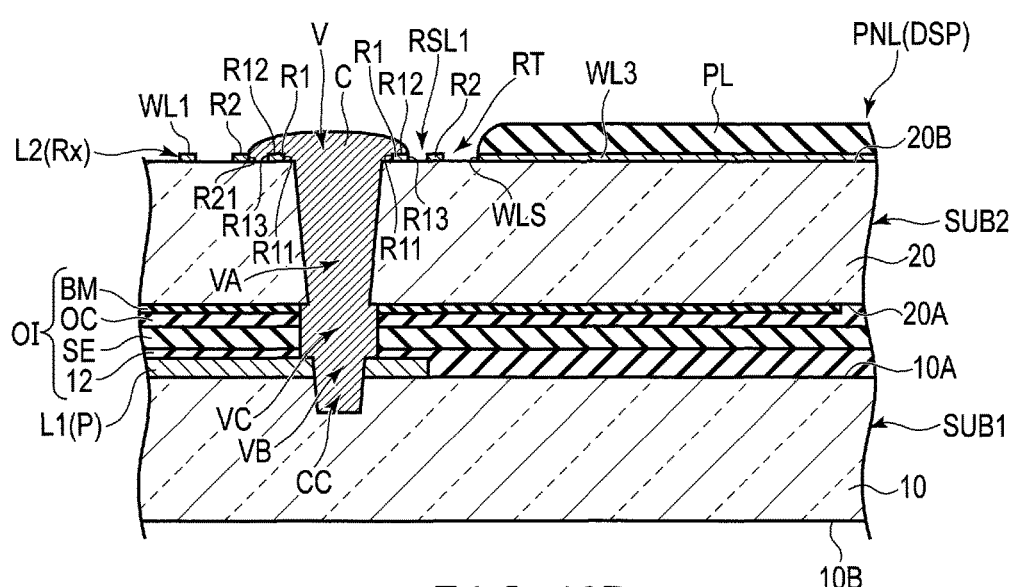
F I G. 13B

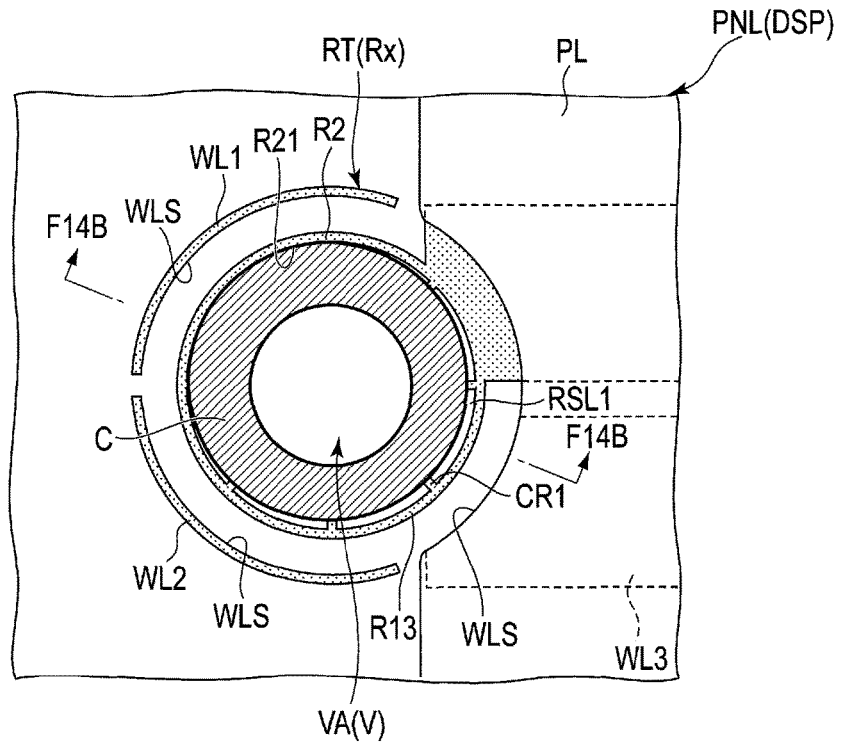
F I G. 14A
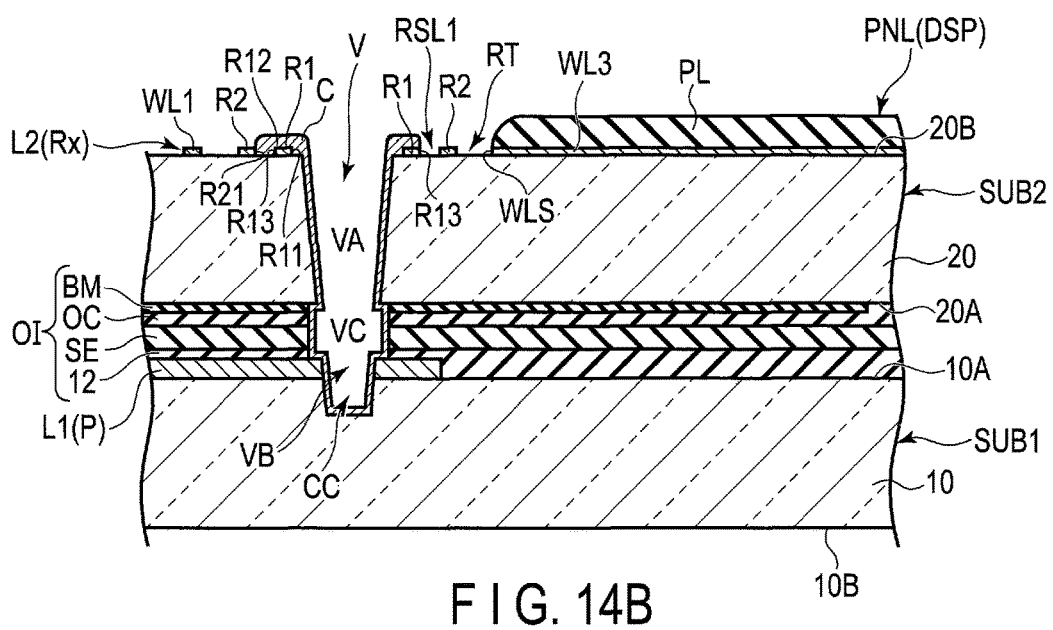
F I G. 14B

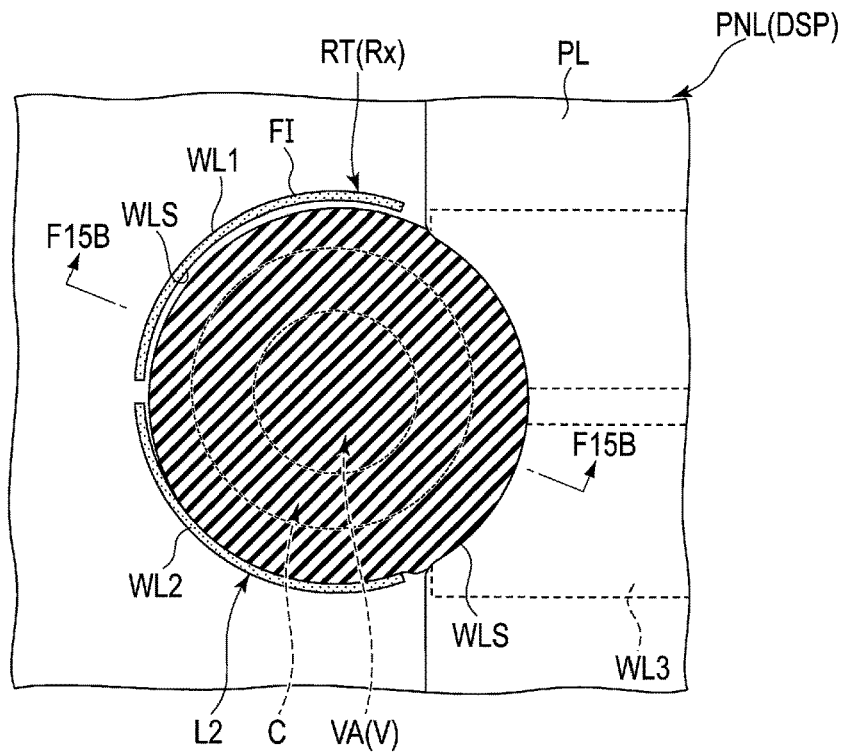
F I G. 15A
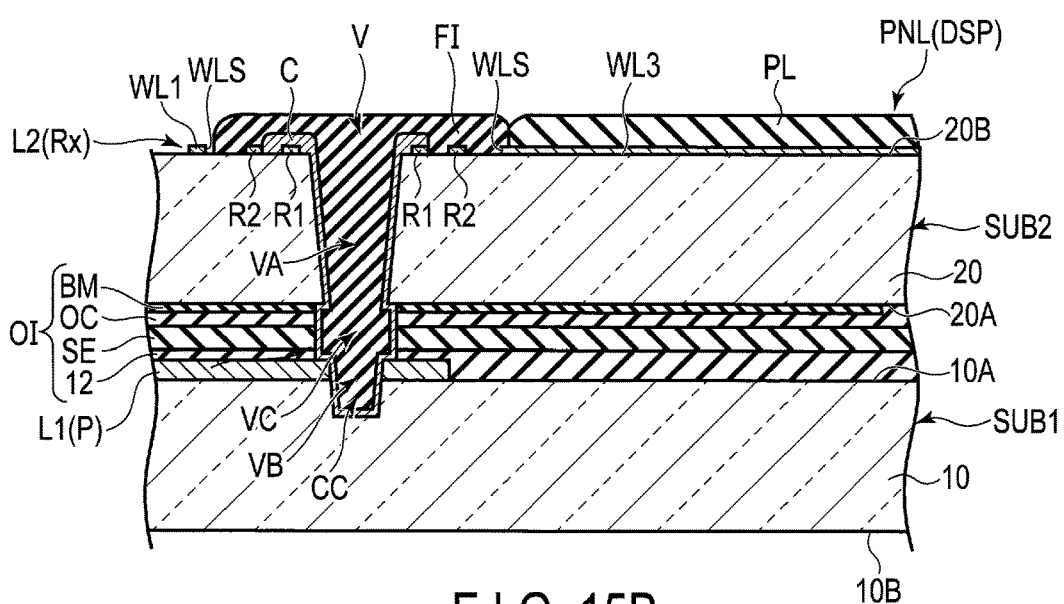
F I G. 15B

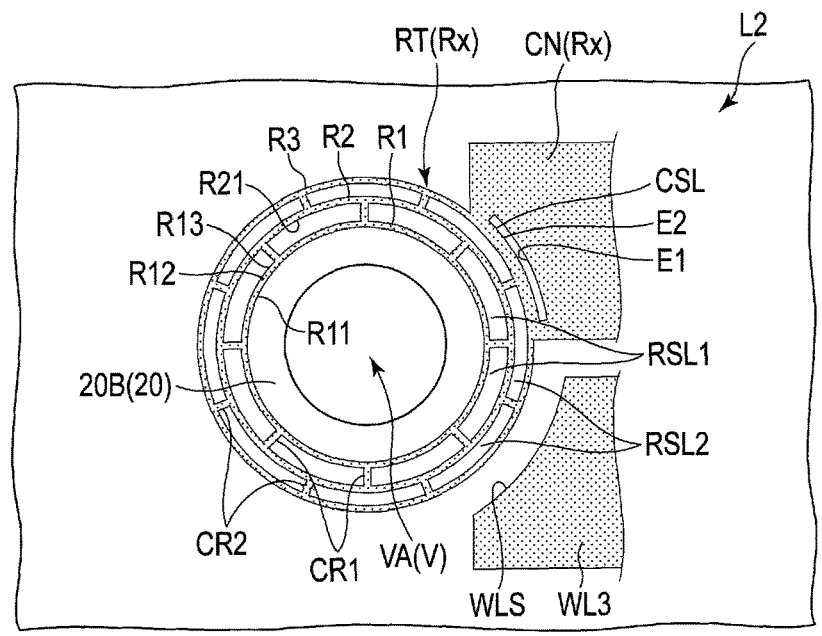
F I G. 16
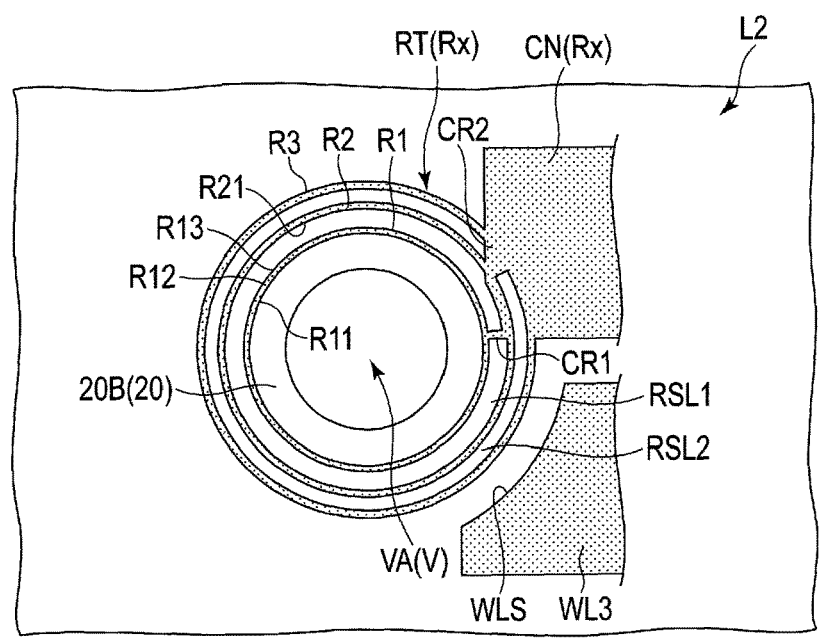
F I G. 17

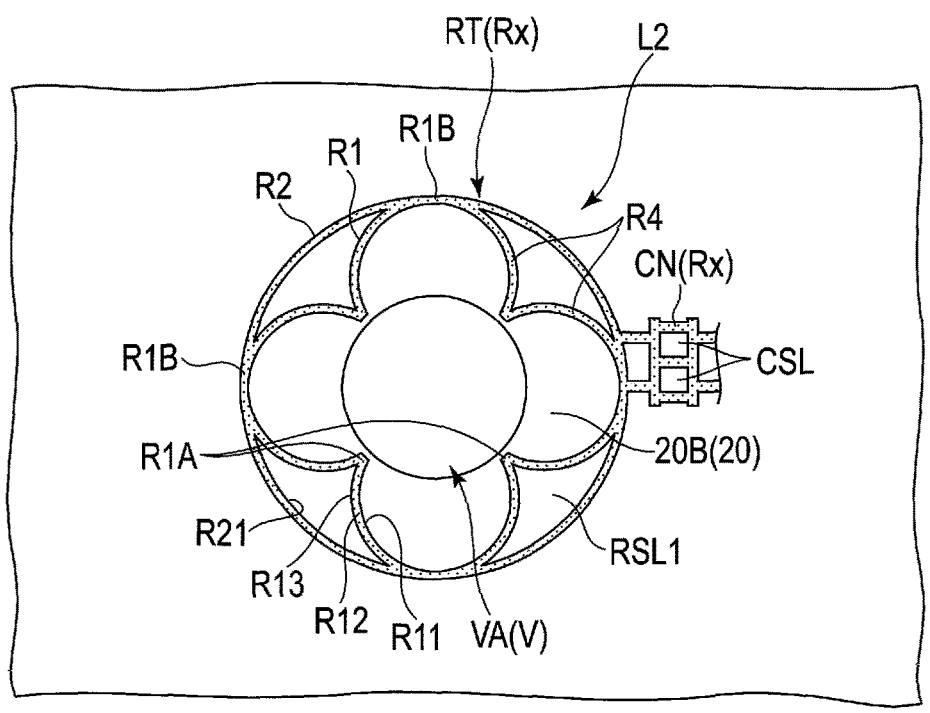
F I G. 18

DISPLAY DEVICE AND INTER-SUBSTRATE CONDUCTING STRUCTURE

CROSS-REFERENCE TO RELATED APPLICATIONS

This application is based upon and claims the benefit of priority from Japanese Patent Application No. 2016-149612, filed Jul. 29, 2016, the entire contents of which are incorporated herein by reference.

FIELD

Embodiments described herein relate generally to a display device and an inter-substrate conducting structure.

BACKGROUND

In electronic apparatuses such as a display device, a demand for high efficiency and low cost of wiring mounting has been further increased. For example, JP 2009-237410 A discloses a technology of providing a through hole on a CF side substrate and filling the through hole with a connecting conductor to form a CF side penetrating electrode that connects between CF front patterns and a CF side rear conductive film formed on front and rear surfaces of the CF side substrate. However, in a liquid crystal display device described in JP 2009-237410 A, there is a risk that the connecting conductor filled in the through hole spreads over a surface of the CF side substrate beyond a desired range.

SUMMARY

The present disclosure relates generally to a display device and an inter-substrate conducting structure. In an embodiment, a display device is provided. The display device includes a first substrate configured to include a first basement and a first conductive layer; a second substrate configured to include a second basement that includes a first main surface opposed to the first conductive layer and spaced apart from the first conductive layer and a second main surface opposite to the first main surface and a second conductive layer that is provided on the second main surface, and be provided with a hole penetrating between the first main surface and the second main surface; and a connecting material configured to electrically connect between the first conductive layer and the second conductive layer via the hole, wherein the second conductive layer includes a first elongated protrusion that is disposed around the hole to surround the hole, and the connecting material comes into contact with the first elongated protrusion. In another embodiment, an inter-substrate conducting structure is provided electrically connecting between a first conductive layer provided on a first substrate and a second conductive layer provided on a second substrate by a connecting material, wherein the first substrate includes a first basement and a first conductive layer provided on the first basement, a second substrate includes a second basement that includes a first main surface opposed to the first conductive layer and spaced apart from the first conductive layer and a second main surface opposite to the first main surface and a second conductive layer that is provided on the second main surface, and is provided with a hole penetrating between the first main surface and the second main surface; the second conductive layer includes a first elongated protrusion that is disposed around the hole to surround the hole, and the connecting material comes into contact with the first elongated protrusion and the first conductive layer via the hole. Additional features and advantages are described herein, and will be apparent from the following Detailed Description and the figures.

BRIEF DESCRIPTION OF THE DRAWINGS

FIG. 1 is a plan view illustrating a configuration example of a display device DSP of a first embodiment;

FIG. 3 is a cross-sectional view illustrating a structure of a display area DA of the display panel PNL illustrated in FIG. 1;

FIG. 6 is a plan view of a second conductive layer L2 illustrated in FIG. 5;

FIG. 7 is an enlarged cross-sectional view of a first elongated protrusion R1 illustrated in FIG. 5;

FIG. 10 is a plan view illustrating another configuration example of a second conductive layer L2 according to the first embodiment;

FIG. 13A is a plan view for describing the method for manufacturing a display device DSP, following FIG. 12A;

FIG. 13B is a cross-sectional view taken along line F13B-F13B in FIG. 13A;

FIG. 14A is a plan view for describing the method for manufacturing a display device DSP, following FIG. 13A;

FIG. 14B is a cross-sectional view taken along line F14B-F14B in FIG. 14A;

FIG. 15A is a plan view for describing the method for manufacturing a display device DSP, following FIG. 14A;

FIG. 15B is a cross-sectional view taken along line F15B-F15B in FIG. 15A;

FIG. 16 is a plan view illustrating a configuration example of a second conductive layer L2 according to a second embodiment;

FIG. 17 is a plan view illustrating a configuration example of a second conductive layer L2 according to a third embodiment; and FIG. 18 is a plan view illustrating a configuration example of a second conductive layer L2 according to a fourth embodiment.

DETAILED DESCRIPTION

Figure 2:
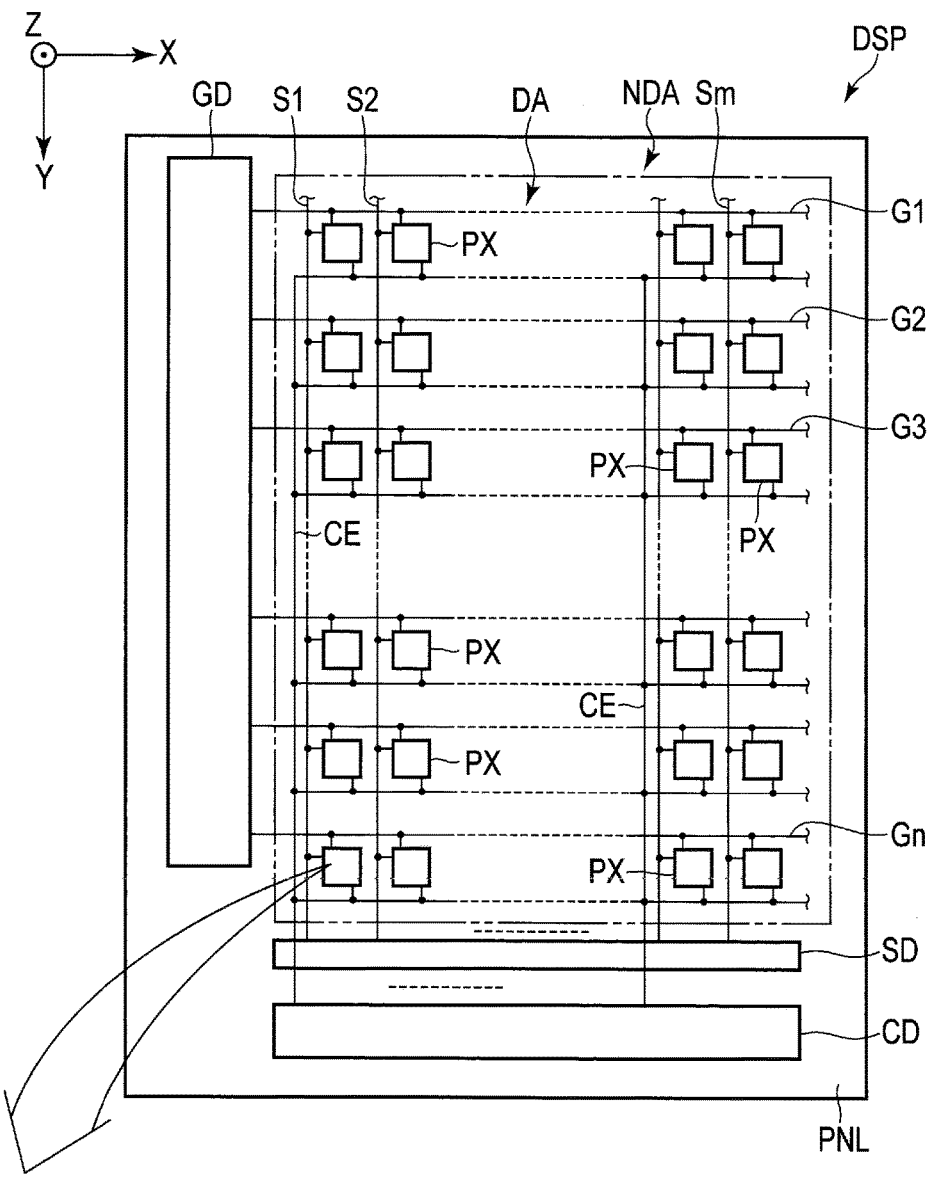
FIG. 2 is a plan view schematically illustrating a basic configuration and an equivalent circuit of a display panel PNL illustrated in FIG. 1.
Figure 2:
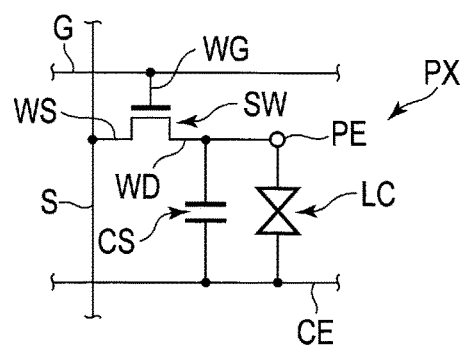

In general, according to one embodiment, a display device includes a first substrate, a second substrate, and a connecting material. The first substrate includes a first basement and a first conductive layer. The second substrate includes a second basement and a second conductive layer. The second basement has a first main surface and a second main surface. The second substrate is provided with a hole. The first main surface is opposed to the first conductive layer and is spaced apart from one conductive layer. The second conductive layer provided on the second main surface has a first elongated protrusion. The connecting material comes into contact with the first elongated protrusion and the first conductive layer. The first elongated protrusion is disposed around the hole and surrounds the hole filled with the connecting material.

In addition, according to one embodiment, in an inter-substrate conducting structure, the first and second conductive layers provided between different substrates are electrically connected to each other by the connecting material. The first substrate includes the first basement and the first conductive layer. The second substrate includes the second basement and the second conductive layer. The second basement has the first main surface and the second main surface. The second substrate is provided with the hole. The first main surface is opposed to the first conductive layer and is spaced apart from one conductive layer. The second conductive layer provided on the second main surface includes the first elongated protrusion. The connecting material comes into contact with the first elongated protrusion and the first conductive layer. The first elongated protrusion is disposed around the hole and surrounds the hole filled with the connecting material.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, and the like of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

In each embodiment, a display device is disclosed as an example of an electronic device. The display device can be used for various devices such as a smart phone, a tablet terminal, a mobile phone terminal, a notebook type personal computer, and a game machine. Main components disclosed in each embodiment can be applied to a liquid crystal display device, a self-luminous display device such as an organic electroluminescence display device, an electronic paper type display device having an electrophoretic element and the like, a display device to which micro-electromechanical systems (MEMS) is applied, or a display device to which electrochromism is applied, and the like.

Further, the electronic device is not limited to the display device, and may be, for example, an external type touch panel substrate that is overlaid and attached on the display device. The present embodiment can be applied to various electronic devices including an inter-substrate conducting structure in which a first basement and a second basement are disposed to be spaced apart from each other, the second basement has a first hole, a first conductive layer located on the first basement and a second conductive layer located on the second substrate are electrically connected to each other via the first hole.

First Embodiment

FIG. 1 is a plan view illustrating an example of a display device DSP of a first embodiment. A first direction X, a second direction Y, and a third direction Z are orthogonal to each other, but may intersect with each other at an angle other than 90°. The first direction X and the second direction Y correspond to a direction parallel to a main surface of a substrate configuring a display device DSP and the third direction Z corresponds to a thickness direction of the display device DSP. Here, as an example of the display device DSP, a liquid crystal display device equipped with a sensor SS will be described.

The display device DSP includes a display panel PNL, an IC chip I1, a wiring substrate SUB3 or the like. The display panel PNL is a liquid crystal panel, and includes a first substrate SUB1, a second substrate SUB2, a seal SE, and a liquid crystal layer LC. The second substrate SUB2 is opposed to the first substrate SUB1 in the third direction Z. The seal SE corresponds to a portion indicated diagonally upward right in FIG. 1 and adheres the first substrate SUB1 to the second substrate SUB2. The liquid crystal layer LC is disposed between the first substrate SUB1 and the second substrate SUB2 at an inner side of the seal SE.

In the following description, a direction from the first substrate SUB1 toward the second substrate SUB2 is referred to as an upward direction and a direction from the second substrate SUB2 toward the first substrate SUB1 is referred to as a downward direction. In addition, what is viewed from the second substrate SUB2 toward the first substrate SUB1 is referred to as a plan view.

The display panel PNL includes a display area DA that displays an image and a frame-like non-display area NDA surrounding the display area DA. The display area DA is an example of a first area and is located inside an area surrounded by the seal SE. The non-display area NDA is an example of a second area and is adjacent to the display area DA. The seal SE is located in the non-display area NDA.

The wiring substrate SUB3 is mounted on the first substrate SUB1. The wiring substrate SUB3 is, for example, a flexible substrate having flexibility. It should be noted that the flexible substrate applicable in the present embodiment may include a flexible portion formed of a bendable material formed in at least a part thereof. In other words, the wiring substrate SUB3 may be a flexible substrate the whole of which is configured as a flexible portion, and may be a rigid flexible substrate including a rigid portion formed of hard materials such as glass epoxy and a flexible portion formed of bendable materials such as polyimide.

The IC chip I1 is mounted on the wiring substrate SUB3. The IC chip I1 is not limited to the example illustrated in FIG. 1, but the IC chip I1 may be mounted on the first substrate SUB1 extending outwardly of the second substrate SUB2, or may be mounted on an external circuit board connected to the wiring substrate SUB3. The IC chip I1 includes, for example, a display driver DD that outputs a signal necessary for displaying an image. The display driver DD includes, for example, at least one of a signal line drive circuit SD, a scanning line drive circuit GD, and a common electrode drive circuit CD which will be described below. In addition, in the example illustrated in FIG. 1, the IC chip I1 includes a detection circuit RC that serves as a touch panel controller or the like. The detection circuit RC may be built in another IC chip different from the IC chip I1.

The display panel PNL may be, for example, a transmissive type having a transmissive display function of selectively transmitting light from a lower side of the first substrate SUB1 to display an image, or may be a reflective type having a reflective display function of selectively reflecting light from an upper side of the second substrate SUB2 to display an image. Alternatively, the display panel PNL may be a transflective type having the transmissive display function and the reflective display function.

The sensor SS performs sensing for detecting a contact or approach of an object to the display device DSP. The sensor SS is provided with a plurality of detection electrodes Rx (Rx1, Rx2, Rx3, Rx4, . . . ). The detection electrode Rx is provided on the second substrate SUB2. Each detection electrode Rx extends in the first direction X and is arranged at intervals in the second direction Y. The detection electrode Rx includes a main body RS and a connector CN. In addition, each detection electrode Rx has a terminal RT (RT1, RT2, RT3, RT4, . . . ).

The main body RS is located in the display area DA and extends in the first direction X. In the detection electrode Rx, the main body is mainly used for sensing. As an example, the main body RS can be formed into a stripe shape by an aggregate of fine metal wires. In addition, in the example illustrated in FIG. 1, one detection electrode Rx includes two main bodies RS, but three or more main bodies RS may be provided, or one main body RS may be provided.

Between each adjacent pair of main bodies RS, a dummy region is created, in which fine metal wires are arranged in substantially the same fashion as that of the main bodies RS. The fine metal wires of the dummy region are in a floating state, which is not connected to any wiring lines.

The terminal RT is located on a right side of the non-display area NDA and is connected to the main body RS. The connector CN is located on the right side or any other side of the non-display area NDA, and connects the plurality of detectors RS to each other, and at the same time, is connected to the terminal RT. In FIG. 1, a part of the terminal RT is formed at a location overlaying the seal SE in planar view The first substrate SUB1 includes pads P (P1, P2, P3, P4, . . . ) and wiring lines W (W1, W2, W3, W4, . . . ). The pad P and the wiring line W are located at one end side or the other end side of the non-display area NDA and overlay the seal SE in planar view. The pad P is formed at a location overlaying the terminal RT in planar view. The wiring line W is connected to the pad P, extends along the second direction Y, and is electrically connected to the detection circuit RC of the IC chip I1 via the wiring substrate SUB3.

The contact hole V (V1, V2, V3, V4, . . . ) is formed at a location where the terminal RT and the pad P are opposed to each other. In addition, the contact hole V may penetrate through the pad P, simultaneously with penetrating the second substrate SUB2 including the terminal RT and the seal SE. In the example illustrated in FIG. 1, the contact hole V has a circular shape in planar view, but it is not limited thereto, and may have other shapes such as an ellipse. The terminal RT is formed slightly larger than the contact hole V. In the example illustrated in FIG. 1, the terminal RT has a circular shape, but it is not limited thereto, and may have other shapes such as an oval. The terminal RT is formed larger than the contact hole V. The shape of the terminal RT of this embodiment will be described in detail later.

The contact hole V is provided with a connecting material C to be described below, and the terminal RT of the detection electrode Rx and the pad P are electrically connected to each other via the connecting material C. The pad P and wiring line W are an example of the first conductive layer L1 provided on the first substrate SUB1, and the detection electrodes Rx are an example of the second conductive layer L2 provided on the second substrate SUB2 spaced apart from the first substrate SUB1.

The detection electrode Rx connected to the pad P is electrically connected to the detection circuit RC via the wiring substrate SUB3 connected to the first substrate SUB1. The detection circuit RC reads a sensor signal output from the detection electrode Rx and detects the presence or absence of the contact or approach of the object, the location coordinate of the object or the like.

In the example illustrated in FIG. 1, all of the terminal RT (RT1, RT3, . . . ), the pad P (P1, P3, . . . ), the wiring line W (W1, W3, . . . ), and the contact hole V (V1, V3, . . . ) of each of the odd-numbered detection electrodes Rx (Rx1, Rx3, . . . ) are located on one end side of the non-display area NDA. In contrast, all of the terminal RT (RT2, RT4, . . . ), the pad P (P2, P4, . . . ), the wiring line W (W2, W4, . . . ), and the contact hole V (V2, V4, . . . ) of each of the even-numbered detection electrodes Rx (Rx2, Rx4, . . . ) are located on the other end side opposite to the one end side of the non-display area NDA. According to the layout, a width of the one end side and a width of the other end side in the non-display area NDA can be uniform, which is suitable for narrowing the frame.

As illustrated in FIG. 1, in the layout in which the pad P3 is closer to the wiring substrate SUB3 than the pad P1, the wiring line W1 bypasses an inner side of the pad P3, that is, a side close to the display area DA, and are disposed in parallel inside the wiring line W3 between the pad P3 and the wiring substrate SUB3. Likewise, the wiring line W2 bypasses an inner side of the pad P4 and is disposed in parallel inside the wiring line W4 between the pad P4 and the wiring substrate SUB3.

FIG. 2 is a plan view schematically illustrating a basic configuration and an equivalent circuit of the display panel PNL illustrated in FIG. 1.

The display panel PNL includes a plurality of pixels PX in the display area DA. Here, a pixel indicates a minimum unit that can be individually controlled according to a pixel signal, and exists in, for example, a region including a switching element disposed at a location where a scanning line and a signal line to be described below intersect each other. The pixels PX are arrayed in a matrix in the first direction X and the second direction Y. In addition, the display panel PNL includes a plurality of scanning lines G (G1 to Gn), a plurality of signal lines S (S1 to Sm), a common electrode CE or the like in the display area DA.

Each scanning line G extends in the first direction X and is arranged in the second direction Y. Each signal line S extends in the second direction Y and is arranged in the first direction X. It should be noted that the scanning line G and the signal line S may not necessarily extend linearly, and a part thereof may be bent. The common electrode CE is arranged over the pixels PX.

The scanning line the signal line S, and the common electrode CE are each led out to the non-display area NDA. In the non-display area NDA, the scanning line G is connected to the scanning line drive circuit GD, the signal line S is connected to the signal line drive circuit SD, and the common electrode CE is connected to the common electrode drive circuit CD. The signal line drive circuit SD, the scanning line drive circuit GD, and the common electrode drive circuit CD may be formed on the first substrate SUB1, and a part or all of them are built in the IC chip I1 illustrated in FIG. 1.

Each pixel PX includes a switching element SW, a pixel electrode PE, a common electrode CE, a liquid crystal layer LC or the like. The switching element SW is formed of, for example, a thin film transistor (TFT) and is electrically connected to the scanning line G and the signal line S. More specifically, the switching element SW includes a gate electrode WG, a source electrode WS, and a drain electrode WD. The gate electrode WG is electrically connected to the scanning line G In the example illustrated in FIG. 2, the electrode electrically connected to the signal line S is the source electrode WS, and the electrode electrically connected to the pixel electrode PE is the drain electrode WD.

The scanning line G is connected to the switching element SW in each of the pixels PX arranged in the first direction X. The signal line S is connected to the switching element SW in each of the pixels PX arranged in the second direction Y. Each of the pixel electrodes PE is opposed to the common electrode CE and drives the liquid crystal layer LC by an electric field generated between the pixel electrode PE and the common electrode CE. A storage capacitor CS is formed, for example, between the common electrode CE and the pixel electrode PE.

FIG. 3 is a cross-sectional view of the display device DSP taken along the first direction X in the display area DA. In the example illustrated in FIG. 3, the display panel PNL mainly has a configuration corresponding to a display mode using a horizontal electric field substantially parallel to an X-Y plane. It should be noted that the display panel PNL may have a configuration corresponding to a vertical electric field perpendicular to the X-Y plane, an inclined electric field to the X-Y plane, or a display mode that uses a combination of the electric fields.

In the display mode using the horizontal electric field, for example, a configuration in which either the first substrate SUB1 or the second substrate SUB2 is provided with both of the pixel electrode PE and the common electrode CE can be applied. In the display mode using the vertical electric field or the inclined electric field, for example, a configuration in which the first substrate SUB1 is provided with any one of the pixel electrode PE and the common electrode CE and the second substrate SUB2 is provided with the other of the pixel electrode PE and the common electrode CE can be applied.

The first substrate SUB1 includes the first basement 10, the signal line S, the common electrode CE, a metal layer M, the pixel electrode PE, a first insulating layer 11, a second insulating layer 12, a third insulating layer 13, a first alignment film AL1 or the like. The first basement 10 has a third main surface 10A that is opposed to the second substrate SUB2 and a fourth main surface 10B opposite to the third main surface 10A. In FIG. 3, the switching elements, the scanning lines, various insulating layers interposed therebetween or the like are omitted.

The first insulating layer 11 is located on the third main surface 10A of the first basement 10. The scanning line or a semiconductor layer of a switching element that is not shown is located between the first basement 10 and the first insulating layer 11. The signal line S is located on the first insulating layer 11. The second insulating layer 12 is located on the signal line S and the first insulating layer 11. The common electrode CE is located on the second insulating layer 12.

The metal layer M comes into contact with the common electrode CE directly above the signal line S. In the example illustrated in FIG. 3, the metal layer M is located on the common electrode CE, but it may be located between the common electrode CE and the second insulating layer 12. The third insulating layer 13 is located on the common electrode CE and the metal layer M. The pixel electrode PE is located on the third insulating layer 13. The pixel electrode PE is opposed to the common electrode CE via the third insulating layer 13. In addition, the pixel electrode PE has a slit SL at a location where the pixel electrode PE is opposed to the common electrode CE. The first alignment film AL1 covers the pixel electrode PE and the third insulating layer 13.

The scanning line the signal line S, and the metal layer M are formed of metal materials such as molybdenum, tungsten, titanium, and aluminum. It should be noted that the scanning line the signal line S, and the metal layer M may have a single layer structure or a multilayer structure. The common electrode CE and the pixel electrode PE are formed of transparent conductive materials such as ITO and IZO. The first insulating layer 11 and the third insulating layer 13 are inorganic insulating layers and the second insulating layer 12 is an organic insulating layer.

It should be noted that the configuration of the first substrate SUB1 is not limited to the example illustrated in FIG. 3, and the pixel electrode PE may be located between the second insulating layer 12 and the third insulating layer 13 and the common electrode CE may be located between the third insulating layer 13 and the first alignment film AL1. In such a case, the pixel electrode PE is formed in a flat plate shape without a slit, and the common electrode CE has a slit opposed to the pixel electrode PE. In addition, both the pixel electrode PE and the common electrode CE may be formed in a comb shape and may be disposed so as to be engaged with each other.

The second substrate SUB2 includes a second basement 20, a light-shielding layer BM, a color filter CF, an overcoat layer OC, a second alignment film AL2 or the like. The second basement 20 has a first main surface 20A opposed to the first substrate SUB1 and a second main surface 20B opposite to the first main surface 20A.

The light-shielding layer BM and the color filter CF are located on the first main surface 20A of the second basement 20. The light-shielding layer BM partitions each pixel and is located directly above the signal line S. The color filter CF is opposed to the pixel electrode PE, and a part thereof overlays the light-shielding layer BM. The color filter CF includes a red color filter, a green color filter, a blue color filter or the like. The overcoat layer OC covers the color filter CF. The second alignment film AL2 covers the overcoat layer OC.

It should be noted that the color filter CF may be disposed on the first substrate SUB1. The color filter CF may include color filters for four or more colors. A pixel displaying white may be provided with a white color filter, provided with an uncolored resin material, or provided with the overcoat layer OC without being provided with the color filter.

A first polarizer PL1 is located between the first basement 10 and an illumination device BL. A second polarizer PL2 is located on the detection electrode Rx that is provided on the second main surface 20B of the second basement 20. It should be noted that the first polarizer PL1 and the second polarizer PL2 may be additionally provided with a retardation film or the like, if necessary.

Figure 4:
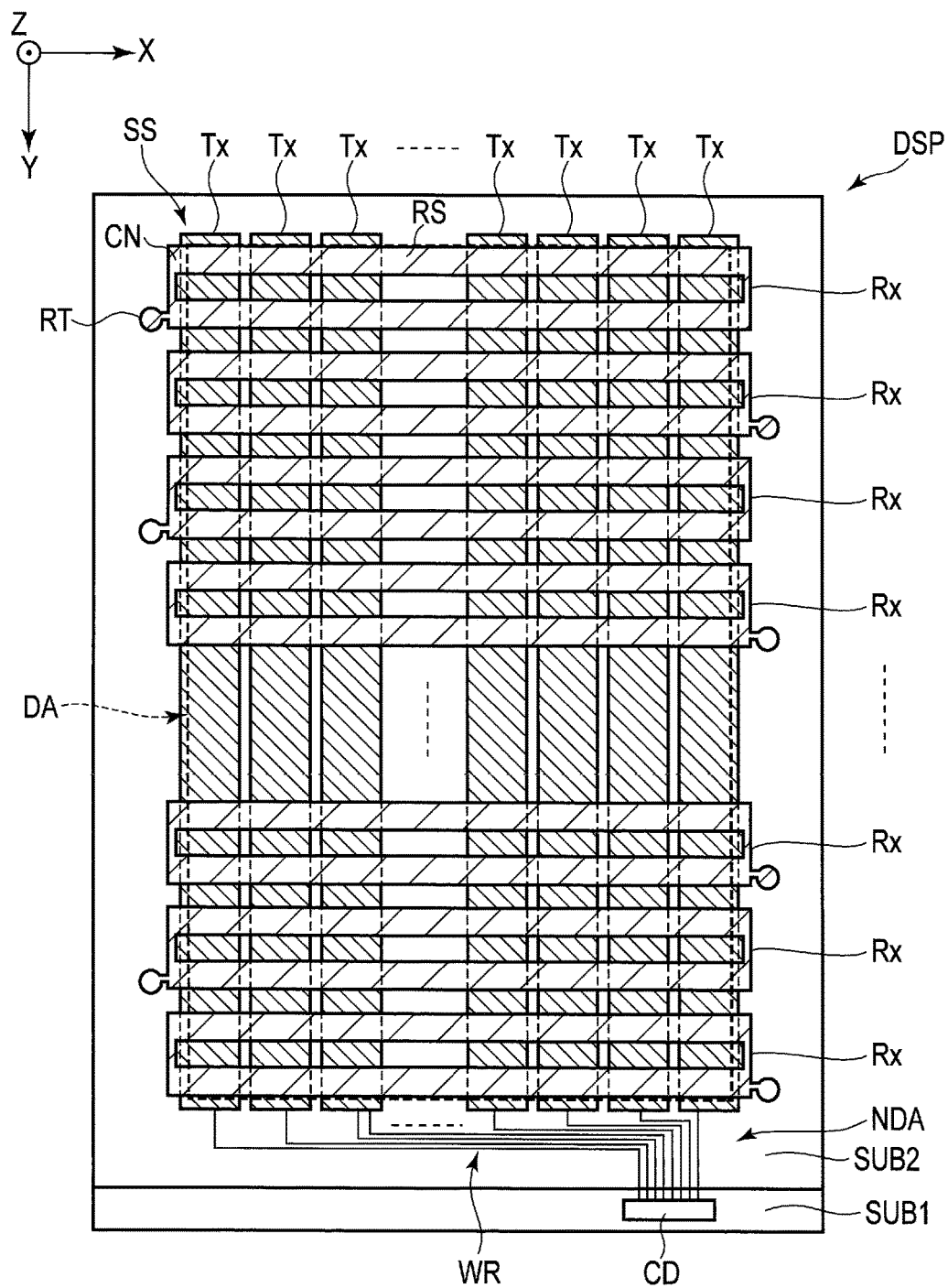
FIG. 4 is a plan view illustrating a configuration example of a sensor SS according to the first embodiment.

A configuration example of the sensor SS mounted on the display device DSP of the present embodiment will be described with reference to FIG. 4. The sensor SS illustrated in FIG. 4 is, for example, a mutual-capacitive electrostatic capacitance type, and can detect a contact or an approach of an object based on a change in electrostatic capacitance between a pair of electrodes opposed to each other via a dielectric. The sensor SS is, for example, an in-cell type touch panel.

The sensor SS includes a sensor driving electrode Tx and the detection electrode Rx. In the example illustrated in FIG. 4, the sensor driving electrode Tx corresponds to a portion indicated diagonally downward right and is provided on the first substrate SUB1. In addition, the detection electrode Rx corresponds to a portion indicated diagonally upward right and is provided on the second substrate SUB2. The sensor driving electrode Tx and the detection electrode Rx intersect with each other in the X-Y plane. The detection electrode Rx is opposed to the sensor driving electrode Tx in the third direction Z.

The sensor driving electrode Tx and the detection electrode Rx are located in the display area DA, and a part of the sensor driving electrode Tx and the detection electrode Rx extends to the non-display area NDA. In the example illustrated in FIG. 4, each of the sensor driving electrodes Tx has a stripe shape extending in the second direction Y, and the sensor driving electrodes Tx are arranged at intervals in the first direction X. Each of the detection electrodes Rx extends in the first direction X and the detection electrodes Rx are arranged at intervals in the second direction Y. The detection electrode Rx is electrically connected to the pad P by the inter-substrate conducting structure and is connected to the detection circuit RC via the wiring line W.

Each of the sensor driving electrodes Tx is electrically connected to the common electrode drive circuit CD via the wiring line W. It should be noted that the number, size and shape of the sensor driving electrodes Tx and the detection electrodes Rx are not particularly limited, and can be variously changed. The sensor driving electrode Tx includes the above-mentioned common electrode CE and serves to generate an electric field between the sensor driving electrode Tx and the pixel electrode PE and generate capacitance between the sensor driving electrode Tx and the detection electrode Rx to detect a location of an object.

The common electrode drive circuit CD supplies a common drive signal to the sensor driving electrode Tx including the common electrode CE during display driving for displaying an image in the display area DA. In addition, the common electrode drive circuit CD supplies a sensor drive signal to the sensor driving electrode Tx during sensing driving for sensing. As the sensor drive signal is supplied to the sensor driving electrode Tx, the detection electrode Rx outputs a sensor signal necessary for sensing, in other words, a signal based on a change in inter-electrode capacitance between the sensor driving electrode Tx and the detection electrode Rx. The detection signal output from the detection electrode Rx is input to the detection circuit RC illustrated in FIG. 1.

It should be noted that the sensor SS is not limited to the mutual capacitive type of detecting an object based on the electrostatic capacitance between the pair of electrodes, that is, the change in the electrostatic capacitance between the sensor driving electrode Tx and the detection electrode Rx, and may be a self-capacitive type that detects an object based on a change in capacitance of the detection electrode Rx itself.

Figure 5:
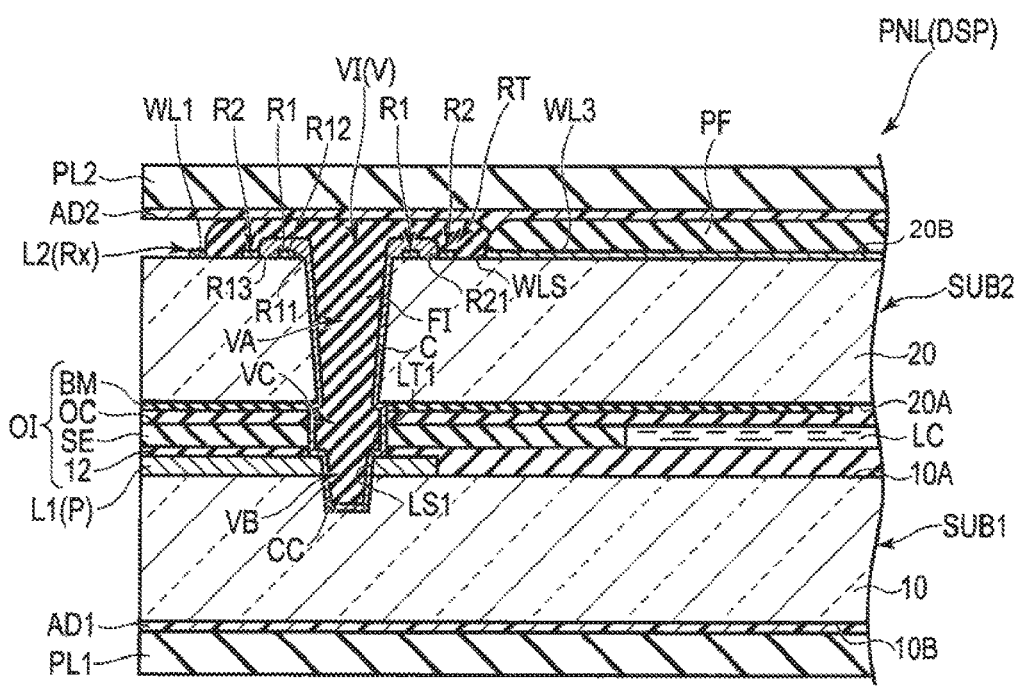
FIG. 5 is a cross-sectional view taken along line F5-F5 in FIG. 1.
Figure 5:
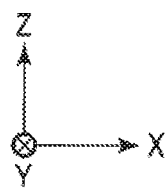

Next, the above-mentioned contact hole V (V1, V2, V3, V4, . . . ) will be described. FIG. 5 is a schematic cross-sectional view of the display device DSP taken along the line F5-F5 in FIG. 1. In the example illustrated in FIG. 5, in the inter-substrate conducting structure provided in the non-display area NDA, the display device DSP includes the first substrate SUB1, the second substrate SUB2, an organic insulating layer OI, a protective film PF, the connecting material C, the first polarizer PL1, and the second polarizer PL2. The first polarizer PL1 adheres to the first substrate SUB1 by an adhesive layer AD1. The second polarizer PL2 adheres to the second substrate SUB2 by an adhesive layer AD2.

The first substrate SUB1 includes the above-mentioned first basement 10 and the first conductive layer L1. The first conductive layer L1 includes the pad P (P1, P2, P3, P4, . . . ) or the wiring line W (W1, W2, W3, W4, . . . ) that are described above and is located on the third main surface 10A side opposed to the second substrate SUB2. The first insulating layer 11 illustrated in FIG. 3, another insulating layer, or another conductive layer may be disposed between the first basement 10 and the pad P and between the first basement 10 and the second insulating layer 12.

The second substrate SUB2 includes the second basement 20 and the second conductive layer L2 described above. The first main surface 20A of the second basement 20 is opposed to the first conductive layer L1 and is spaced apart from the first conductive layer L1 in the third direction Z. The second conductive layer L2 includes the above-mentioned detection electrode Rx, that is, the terminal RT (RT1, RT2, RT3, RT4, . . . ), the connector CN, and the main body RS. The second conductive layer L2 is located on the second main surface 20B side and is covered with the protective film PF. In other words, the first basement 10, the first conductive layer L1, the second basement 20, the second conductive layer L2, and the protective film PF are arranged in the third direction Z in this order.

The organic insulating layer OI is located between the first conductive layer L1 and the second basement 20. Instead of the organic insulating layer OI, an inorganic insulating layer or another conductive layer may be located, or an air layer may be located. It should be noted that various insulating layers and various conductive layers may be disposed between the second basement 20 and the second conductive layer L2 or on the second conductive layer L2.

For example, the organic insulating layer OI includes the seal SE for bonding between the first substrate SUB1 and the second substrate SUB2, the second insulating layer 12 of the first substrate SUB1, the light-shielding layer BM of the second substrate SUB2, the overcoat layer OC or the like. The seal SE is located between the second insulating layer 12 and the overcoat layer OC. The liquid crystal layer LC is located in a gap between the first substrate SUB1 and the second substrate SUB2 and is surrounded by the seal SE.

It should be noted that the metal layer M, the third insulating layer 13, and the first alignment film AL1 illustrated in FIG. 3 may be interposed between the second insulating layer 12 and the seal SE. The second alignment film AL2 illustrated in FIG. 3 may be interposed between the overcoat layer OC and the seal SE.

The first and second basements 10 and 20 are glass substrates formed of, for example, alkali-free glass. The first and second basements 10 and 20 may be flexible substrates formed from polyimide resin or the like. The protective film PF is formed of, for example, organic insulating materials such as an acrylic resin. The first and second conductive layers L1 and L2 are formed of, for example, metal materials such as molybdenum, tungsten, titanium, aluminum, silver, copper, and chromium, an alloy in which these metal materials are combined, or transparent conductive materials such as indium tin oxide (ITO) or indium zinc oxide (IZO). The first and second conductive layers L1 and L2 may also have a single layer structure or a multilayer structure.

As illustrated in FIG. 5, the second substrate SUB2 has a first hole VA penetrating the second conductive layer L2 (the detection electrode Rx) and the second basement 20. In the example shown in FIG. 5, the second conductive layer L2 is not present at a location overlapping the first hole VA, and therefore the first hole VA is formed to penetrate the second basement 20 from the second main surface 20B to the first main surface 20A.

In addition to the first hole VA, the display device DSP has a second hole VB penetrating the first conductive layer L1, a third hole VC penetrating each organic insulating layer OI, and a concavity CC formed in the first basement 10. The first to third holes VA, VB, VC and the concavity CC communicate with each other and configure the above-mentioned contact hole V. The second hole VD penetrates the first conductive layer L1 at the pad P and is opposed to the first hole VA in the third direction Z. The third hole VC includes a hole penetrating the second insulating layer 12, a hole penetrating the seal SE, a hole penetrating a light-shielding layer BM and the overcoat layer OC or the like.

The third hole VE is extended in the second direction Y as compared with the first and fourth holes VA and VD. It should be noted that the fifth hole VE extends beyond the first and fourth holes VA and VD over all directions on the X-Y plane as well as in the second direction Y. In addition, an inner surface LS1 of the first conductive layer L1 is formed to be approximately flush with an edge of the concavity CC of the first basement 10. For this reason, the first conductive layer L1 has an upper surface LT1 that is not covered with the organic insulating layer OI in the vicinity of the fourth hole VD.

The concavity CC is formed from the third main surface 10A toward the fourth main surface 10B of the first basement 10 and does not penetrate up to the fourth main surface 10B. The concavity CC is opposed to the third hole VC in the third direction Z. In one example, the depth of the concavity CC along the third direction Z is about ⅕ to about ½ of a thickness of the first basement 10 in the third direction Z.

All of the fourth and fifth holes VD and VE and the concavity CC are located directly under the first to third holes VA, VB, and VC, and the third hole VC, the second hole VB, the first hole VA, the fifth hole VE, the fourth hole VD, and the concavity CC are arranged in the third direction Z in order. The contact hole V can be formed by irradiating laser light or etching from above the second substrate SUB2. Various organic insulating layers OI on which the fourth hole VD is provided are formed from, for example, materials having a melting point lower than that of the second basement 20 on which the first hole VA is provided and the first conductive layer L1 on which the third hole VC is provided. Alternatively, various organic insulating layers OI are formed from materials that are easily etched.

As illustrated in FIG. 5, the connecting material C is disposed in the contact hole V. For example, it is preferable that the connecting material C contains metal materials such as silver, and the metal material includes fine particles having a particle diameter of the order of several nanometers to several tens of nanometers. The connecting material C electrically connects between the first conductive layer L1 and the second conductive layer L2 via the contact hole V. In the example illustrated in FIG. 5, the connecting material C comes into contact with an inner circumferential surface LS2, an upper surface LT2, and an outer circumferential surface LU2 of the terminal RT in the second conductive layer L2, respectively, and comes into contact with an inner surface LS1 and an upper surface LT1 of the pad Pin the first conductive layer L1, respectively.

In the example illustrated in FIG. 5, the connecting material C is provided on the inner surfaces of the first to fifth holes VA, VB, VC, VD, and VE and the concavity CC, respectively, but the connecting material C is formed into a thin film and is not filled in the vicinity of centers of the contact holes V. For this reason, the contact holes V each comprises a hollow. The connecting material C having such a thin film shape is formed by injecting the connecting material C into the contact hole V under a barometric pressure or under the environment of atmospheric pressure lower than the barometric pressure and removing a solvent contained in the connecting material C.

The hollow of each of the contact holes V is filled up with a filling material FI. The filling material FI is formed of, for example, the same material as the protective film PF. It should be noted that the contact holes may be filled with the connecting material C so as not to have the hollow.

The connecting material C is continuously formed between the first conductive layer L1 and the second conductive layer L2 without being interrupted. By doing so, the second conductive layer L2 is electrically connected to the above-mentioned wiring substrate SUB3 via the connecting material C and the first conductive layer L1. For this reason, a control circuit that writes a signal into the second conductive layer L2 or reads a signal output from the second conductive layer L2 can be connected to the second conductive layer L2 via the wiring substrate SUB3. Therefore, in order to connect between the second conductive layer L2 and the control circuit, there is no need to separately provide a wiring substrate for the second substrate SUB2.

Next, the second conductive layer L2 (terminal RT) connected to the connecting material C will be described with reference to FIGS. 6 to 8. FIG. 6 is a plan view of a terminal RT (RT1, RT2, RT3, RT4, . . . ) according to the present embodiment when viewed from the second substrate SUB2 side. In the example illustrated in FIG. 6, the terminal RT has a first elongated protrusion R1, a second elongated protrusion R2, a first connection portion CR1, a projecting portion ER, and wall portions WL1, WL2, and WL3.

The first elongated protrusion R1 is formed in an elongated annular (protruding) shape that is extended in the circumferential direction of the first hole VA. A width RW1 of the first elongated protrusion R1 is formed larger than a width RW2 of the second elongated protrusion R2. If the width of the first elongated protrusion R1 is wide, a contact area with the connecting material C is increased, and connection reliability with the connecting material C can be improved.

The width RW2 of the second elongated protrusion R2 is about several μm to tens of μm like a thin metal wire forming the above-mentioned body portion RS, and the width RW1 of the first elongated protrusion R1 is equal to or larger than the width RW2 of the second elongated protrusion R2.

The first elongated protrusion R1 is provided to surround the first hole VA in a state where it is spaced apart from the periphery of the first hole VA. In the example illustrated in FIG. 6, an interval between the first hole VA and the inner circumferential surface R11 of the first elongated protrusion R1 is constant. Between the first hole VA and the first elongated protrusion R1, the second main surface 20B of the second basement 20 is exposed from the second conductive layer L2.

Like the first elongated protrusion R1, the second elongated protrusion R2 is formed in an elongated annular (protruding) shape that is extended in the circumferential direction of the first hole VA. The second elongated protrusion R2 is formed to have a diameter larger than that of the first elongated protrusion R1 formed in the same annular shape, and is disposed to surround the first elongated protrusion R1. In other words, the second elongated protrusion R2 is disposed outside the first elongated protrusion R1 when viewed from the first hole VA.

In the example illustrated in FIG. 6, the first and second elongated protrusions R1 and R2 are disposed so that their central axes coincide with each other, and an interval between the outer circumferential surface R13 of the first elongated protrusion R1 and an inner circumferential surface R21 of the second elongated protrusion R2 is constant. In other words, a slit RSL1 through which the second main surface 20B is exposed from the second conductive layer L2 is formed between the first elongated protrusion R1 and the second elongated protrusion R2. A width of the slit RSL1 need not be constant over the entire circumference but may be partially different.

The first connection portion CR1 is disposed to cross the slit RSL1 and connects the first elongated protrusion R1 and the second elongated protrusion R2 to each other. The number of first connection portions CR1 may be one or plural. If the number of first connection portions CR1 is plural, the connection reliability between the first elongated protrusion R1 and the second elongated protrusion R2 is improved. In the example illustrated in FIG. 6, eight first connection portions CR1 are disposed at regular intervals.

The first elongated protrusion R1 is electrically connected to a body portion RS (illustrated in FIG. 1) of the detection electrode Rx via the first connection portion CR1, the second elongated protrusion R2, and the connector CN of the detection electrode Rx. The body portion RS is an example of an electrode portion.

The projecting portion ER is extended from the inner circumferential surface R11 of the first elongated protrusion R1 toward the first hole VA. The projecting portion ER is extended between the first hole VA and the first elongated protrusion R1 and improves the connection reliability between the connecting material C filled in the first hole VA and the first elongated protrusion R1. The number of projecting portions ER may be one or plural. If the number of projecting portions ER is plural, the connection reliability can be further improved. In the example illustrated in FIG. 6, eight projecting portions ER are disposed at regular intervals. In addition, in the example illustrated in FIG. 6, the projecting portion ER and the first connection portion CR1 are arranged on the same straight line. As another example, the projecting portion ER and the first connection portion CR1 may be spaced apart from each other in the circumferential direction of the first hole VA.

The wall portions WL1, WL2, and WL3 are disposed outside the second elongated protrusion R2 when viewed from the first hole VA. It can also be said that the wall portions WL1, WL2, and WL3 are disposed outside the second elongated protrusion R2 in a radial direction of the first hole VA. In the example illustrated in FIG. 6, the wall portions WL1 and WL2 are formed in an elongated protrusion shape like the first and second elongated protrusions R1 and R2. The wall portion WL3 is formed in a flat plate shape. The shapes of wall portions WL1, WL2, and WL3 are not limited thereto, and can be variously changed.

In addition, the wall portions WL1, WL2, and WL3 need not to be connected to the first elongated protrusion R1. It should be noted that the wall portions WL1, WL2, and WL3 and the first elongated protrusion R1 may be connected to each other. In the example illustrated in FIG. 6, the wall portions WL1, WL2, and WL3 are electrically isolated from other portions of the second conductive layer L2. Although not illustrated, as another configuration example, the wall portion WL3 surrounding the contact hole V1 at the terminal RT1 of the detection electrode Rx1 may be configured by the connector CN of the detection electrode Rx2 adjacent to the detection electrode Rx1.

The wall portions WL1, WL2, and WL3 each have an inner surface WLS opposed to the first hole VA. In the example illustrated in FIG. 6, an interval between the first hole VA and the inner surface WLS is constant. The interval between the first hole VA and the inner surface WLS need not be constant over the entire circumference but may be partially different.

In a method for manufacturing a display device DSP to be described later, the wall portions WL1, WL2, and WL3 prevent a filling material FI covering the connecting material C from spreading outwardly of the inner surface WLS. In addition, the wall portions WL1, WL2, and WL3 prevent the protective film PF covering the body portion RS or the connector CN of the second conductive layer L2 from spreading inwardly of the inner surface WLS.

FIG. 7 is an enlarged cross-sectional view of the first elongated protrusion R1. As illustrated in FIG. 7, the first elongated protrusion R1 includes a conductive layer M1 provided on the second main surface 20B of the second basement 20 and a blackened layer M2 stacked on the conductive layer M1. It should be noted that other portions of the second conductive layer L2, that is, the second elongated protrusion R2, the first connection portion CR1, the projecting portion ER, the wall portions WL1, WL2, and WL3 or the like have the conductive layer M1 and the blackened layer M2, like the first elongated protrusion R1.

The blackened layer M2 is formed in an overhanging shape having a width larger than that of the conductive layer M1. Such a cross section can be formed, for example, by stacking materials having different etching rates. In the example illustrated in FIG. 7, the conductive layer M1 is formed of, for example, metal, and the blackened layer M2 is formed of, for example, metal oxide.

The blackened layer M2 having a width larger than that of the conductive layer M1 covers the conductive layer M1 so that the conductive layer M1 can not be visible not only in a direction perpendicular to an XY plane but also an oblique direction with respect to the XY plane. If the first elongated protrusion R1 has a cross section illustrated in FIG. 7, since the connecting material C contacting the conductive layer M1 is hard to move to the blackened layer M2, the connecting material C is easily controlled to move along the inner circumferential surface R11 of the first elongated protrusion R1.

Figure 8:
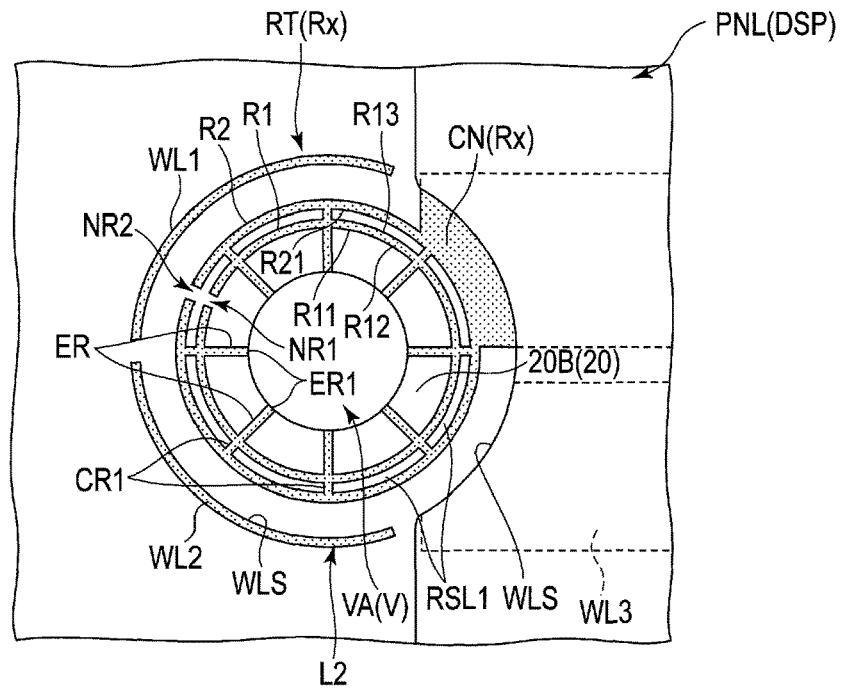
FIG. 8 is a plan view illustrating another configuration example of first and second elongated protrusions R1 and R2 according to the first embodiment.

FIG. 8 is a plan view illustrating another configuration example of the first elongated protrusion R1 according to the present embodiment. The configuration example illustrated in FIG. 8 is different from the configuration example illustrated in FIG. 6 in that the first elongated protrusion R1 or the second elongated protrusion R2 does not have an annular shape continued over the entire circumference but a part thereof is provided with discontinuous portions NR1 and NR2 whose annular ring is disconnected. In the example illustrated in FIG. 8, the discontinuous portion NR1 included in the first elongated protrusion R1 and the discontinuous portion NR2 included in the second elongated protrusion R2 are arranged in the same direction when viewed from the first hole VA. The discontinuous portion NR1 and the discontinuous portion NR2 may be positioned in different directions when viewed from the first hole VA.

The first elongated protrusion R1 including the discontinuous portion NR1 surrounds the first hole VA. The second elongated protrusion R2 including the discontinuous portion NR2 surrounds the first elongated protrusion R1. In the present specification, the term "to surround" is not limited to the configuration in which the first hole VA is surrounded by the first elongated protrusion R1 formed without being disconnected over the entire circumference, but includes a configuration in which the first hole VA is surrounded by the first elongated protrusion R1 of which a part is slightly disconnected. Similarly, it includes a configuration in which the first elongated protrusion R1 is surrounded by the second elongated protrusion R2 of which a part is slightly disconnected.

Even in the configuration example illustrated in FIG. 8, like the configuration example illustrated in FIG. 6, the first elongated protrusion R1 can be electrically connected to the body portion RS of the detection electrode Rx illustrated in FIG. 1. In addition, the connecting material C injected into the first hole VA spreads along the inner circumferential surface R11 of the first elongated protrusion R1 due to surface tension. In the configuration example illustrated in FIG. 8, the connecting material C leaked from the discontinuous portion NR1 spreads along the outer circumferential surface R13 of the first elongated protrusion R1 due to the surface tension. According to the configuration example illustrated in FIG. 8, it is possible to suppress the connecting material C from spreading beyond the terminal RT by keeping the connecting material C in the vicinity of the first elongated protrusion R1.

Figure 9:
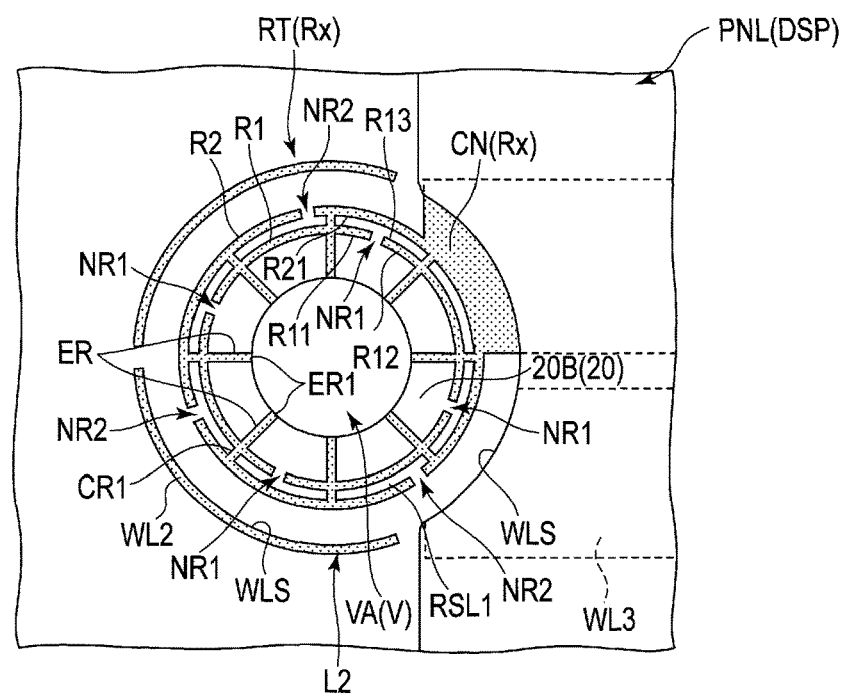
FIG. 9 is a plan view illustrating another configuration example of the first and second elongated protrusions R1 and R2 according to the first embodiment.

FIG. 9 is a plan view illustrating another configuration example of the first elongated protrusion R1 according to the present embodiment. The configuration example illustrated in FIG. 9 is different from the configuration example illustrated in FIG. 8 in that a plurality of discontinuous portions NR1 are included in the first elongated protrusion R1 and a plurality of discontinuous portions NR2 are included in the second elongated protrusion R2.

In the first and second elongated protrusions R1 and R2 illustrated in FIG. 9, focusing on a portion sandwiched between a pair of first connection portions CR1 adjacent to each other, when the discontinuous portion NR1 is included in the first elongated protrusion R1, the discontinuous portion NR2 is not included in the second elongated protrusion R2 parallel with the first elongated protrusion R1. Similarly, when the discontinuous portion NR2 is included in the second elongated protrusion R2, the discontinuous portion NR1 is not included in the first elongated protrusion R1 parallel with the second elongated protrusion R2. For this reason, at the portion sandwiched between the pair of first connection portions CR1, even if any one of the first and second elongated protrusions R1 and R2 is disconnected, an electrical connection is secured by the other of the first and second elongated protrusions R1 and R2.

Even in the configuration example illustrated in FIG. 9, like the configuration example illustrated in FIG. 8, the first elongated protrusion R1 can be electrically connected to the body portion RS of the detection electrode Rx illustrated in FIG. 1. In addition, it is possible to suppress the connecting material C from spreading beyond the terminal RT by keeping the connecting material C, which is injected into the first hole VA, in the vicinity of the first elongated protrusion R1.

FIG. 10 is a plan view illustrating another configuration example of the second conductive layer L2 according to the present embodiment. The configuration example illustrated in FIG. 10 is different from the configuration example illustrated in FIG. 6 in that slits CSL and WSL penetrating the second conductive layer L2 are formed on the connector CN of the detection electrode Rx and the wall portion WL3, respectively.

In the example illustrated in FIG. 10, the slits CSL and WSL are arranged in plural in the second direction Y to form rows. The plurality of rows are arranged in the first direction X. The slits CSL and WSL adjacent to each other in the first direction X are disposed to be displaced from each other. In the example illustrated in FIG. 10, the slits CSL and WSL have a rectangular shape, but may have other shapes.

Even in the configuration example illustrated in FIG. 10, like the configuration example illustrated in FIG. 6, the first elongated protrusion R1 can be electrically connected to the body portion RS of the detection electrode Rx illustrated in FIG. 1.

Next, an example of a method for manufacturing a display device DSP will be described with reference to FIGS. 11A to 15B.

Figure 11A:
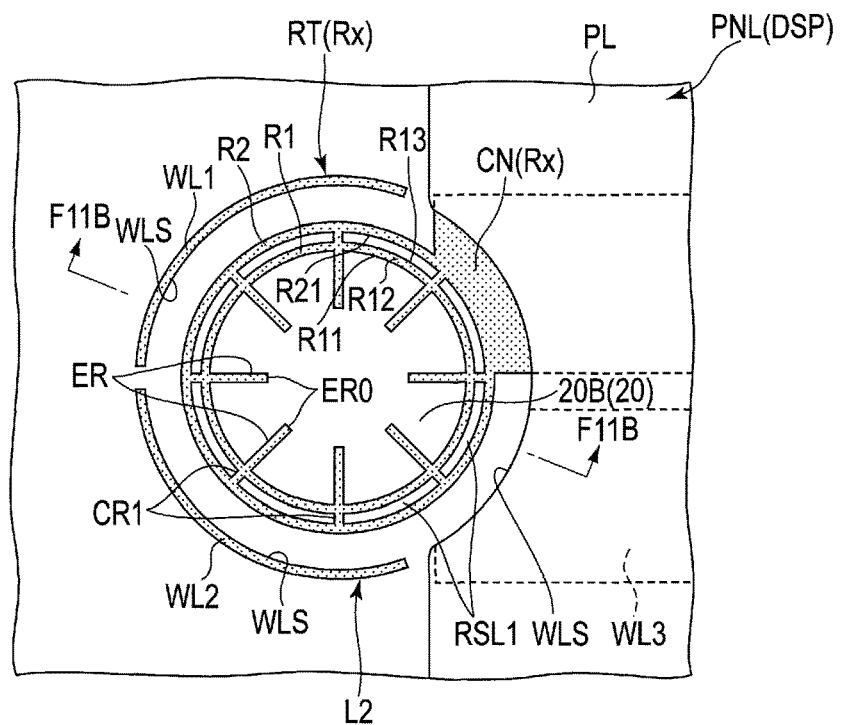
FIG. 11A is a plan view for describing a method for manufacturing a display device DSP according to the first embodiment.
Figure 11B:
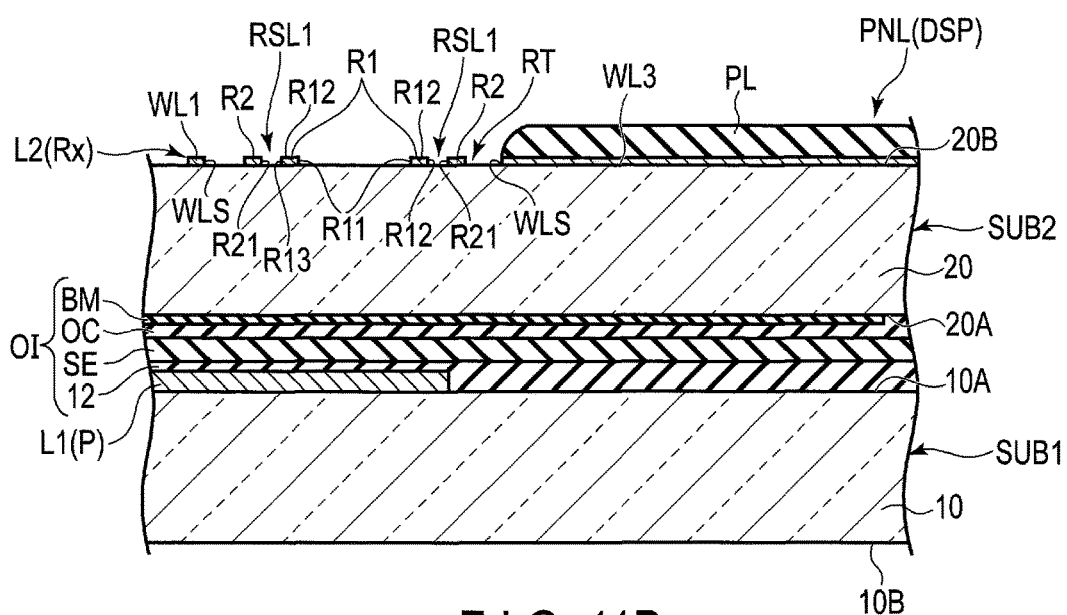
FIG. 11B is a cross-sectional view taken along line F11B-F11B in FIG. 11A.

First, as illustrated in FIGS. 11A and 11B, a display panel PNL is prepared. The display panel PNL illustrated in FIGS. 11A and 11B includes a first substrate SUB1 that has at least the first basement 10 and the first conductive layer L1 and a second substrate SUB2 that has at least the second basement 20 and the second conductive layer L2.

In the display panel PNL, the first substrate SUB1 and the second substrate SUB2 adhere to each other by a seal SE in a state where the second basement 20 is opposed to the first conductive layer L1 and the second basement 20 is spaced apart from the first conductive layer L1. In the second conductive layer L2, the first elongated protrusion R1 or the like is patterned in the terminal RT in advance, and the connector CN and the body portion RS illustrated in FIG. 1 are covered with the protective film PF.

Describing an example of the method for manufacturing a display panel PNL, the second conductive layer L2 (detection electrode Rx) is patterned on the second main surface 20B of the second basement 20. The body portion RS and the connector CN of the detection electrode Rx are covered with the protective film PF.

At this point, the protective film PF applied by inkjet or the like spreads along the inner surface WLS of the wall portion WL3 that is patterned by surface tension. The terminal RT of the detection electrode Rx is exposed from the protective film PF. By doing so, the display panel PNL illustrated in FIGS. 11A and 11B is manufactured. It should be noted that the protective film PF may be applied to completely cover the detection electrode Rx, including the terminal RT. In that case, the display panel PNL illustrated in FIGS. 11A and 11B can be manufactured by irradiating laser light to remove the protective film PF and exposing the terminal RT.

Figure 12A:
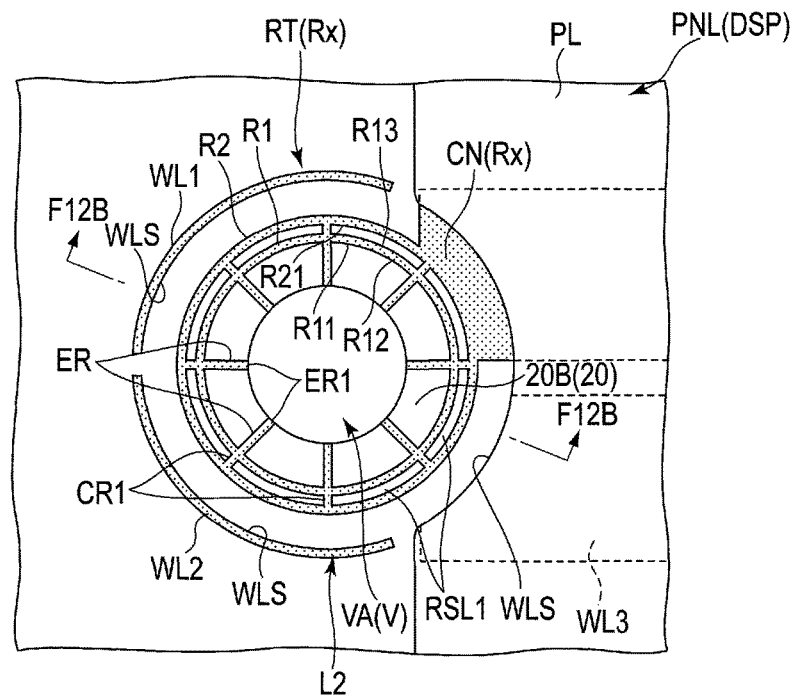
FIG. 12A is a plan view for describing a method for manufacturing a display device DSP, following FIG. 11A.
Figure 12B:
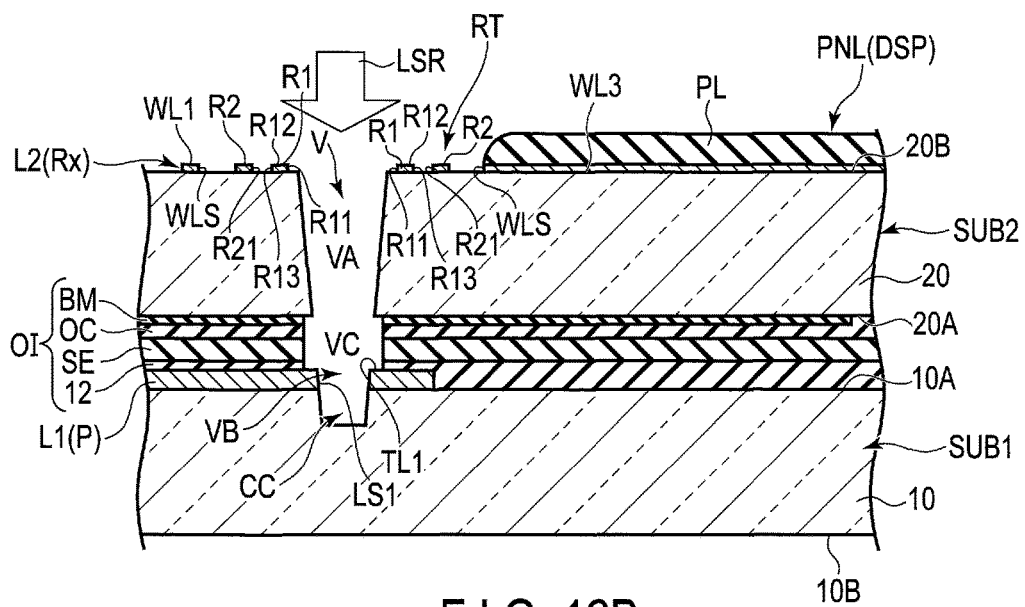
FIG. 12B is a cross-sectional view taken along line F12B-F12B in FIG. 12A.

Subsequently, as illustrated in FIGS. 12A and 12B, the second substrate SUB2 is irradiated with the first laser light LSR. In the example illustrated in FIG. 12B, the laser light LSR is irradiated from above the second conductive layer L2. As a laser light source, for example, a carbon dioxide gas laser device or the like can be applied, but any device that can perform a drilling process on a glass material and an organic material can be used, and an excimer laser device or the like can also be applied.

By the laser light LSR, as illustrated in FIG. 12B, the first hole VA penetrating the second basement 20 is formed. In addition, in the example illustrated in FIG. 12B, the third hole VC penetrating the organic insulating layer OI (light-shielding layer BM, overcoat layer, OC seal SE, second insulating layer 12, etc.), the second hole VB penetrating the first conductive layer L1, and even the concavity CC of the first basement 10 are simultaneously formed when the laser light is irradiated. By doing so, the contact hole V for connecting between the first conductive layer L1 and the second conductive layer L2 is formed.

Furthermore, as illustrated in FIG. 12A, a surplus portion ER0 of the projecting portion ER illustrated in FIG. 11A is trimmed by the laser light LSR so that a distal end ER1 of the projecting portion ER reaches the edge of the first hole VA. Since the laser light LSR is irradiated to an area where the first elongated protrusion R1 is not formed, the laser light does not damage the first elongated protrusion R1.

Subsequently, the connecting material C for electrically connecting between the first conductive layer L1 and the second conductive layer L2 is formed. First, after disposing the display panel PNL inside a chamber CB, the interior of the chamber CB is decompressed to exclude air from the contact hole V. After the decompression, as illustrated in FIGS. 13A and 13B, the connecting material C is injected into the contact hole V. The injection device may be an ink jet or a dispenser. If air, an inert gas or the like is introduced into the chamber CB in the state where the connecting material C is injected into the first hole VA of the contact hole V, the connecting material C is pressed in the third hole VC, the second hole VB, and the concavity CC of the contact hole V due to a pressure difference. By doing so, the connecting material C comes into contact with the first conductive layer L1. Note that this step can be carried out under ordinary atmospheric environment.

The first elongated protrusion R1 is formed around the first hole VA. A contact angle between the injected connecting material C and the second conductive layer L2 is large and a contact angle between the injected connecting material C and the second main surface 20B of the second basement 20 is small. Due to the difference in wettability, the connecting material C injected into the first hole VA spreads along the inner circumferential surface R11 of the first elongated protrusion R1. By doing so, it is possible to suppress the connecting material C from spreading outwardly of the first elongated protrusion R1.

Furthermore, the second elongated protrusion R2 surrounding the first elongated protrusion R1 is formed on the second conductive layer L2. For example, if the connecting material C is excessively injected, the connecting material C overflowing from the first elongated protrusion R1 spreads along the inner circumferential surface R21 of the second elongated protrusion R2. The second elongated protrusion R2 serves as a levee to prevent the connecting material C from spreading outwardly of the second elongated protrusion R2. By doing so, the injected connecting material C can come into contact with not only the inner circumferential surface R11 and the upper surface R12 of the first elongated protrusion R1 but also the outer circumferential surface R13 thereof in a wrap around manner.

In addition, the first elongated protrusion R1 is provided with the projecting portion ER that is extended toward the first hole VA. Contrary to the above example, if the injected connecting material C is insufficient, the projecting portion ER extended to the first hole VA and the connecting material C come into contact with each other, such that the first elongated protrusion R1 and the connecting material C can be connected to each other.

Since the second conductive layer L2 has the second elongated protrusion R2 and the projecting portion ER in addition to the first elongated protrusion R1, it is possible to prevent the connecting material C from spreading outwardly of the second elongated protrusion R2 regardless of whether the amount of the injected connecting material C is large or small. The connection reliability between the connecting material C and the first elongated protrusion R1 can also be secured.

Thereafter, as illustrated in FIGS. 14A and 14B, a solvent contained in the connecting material C is removed, such that a volume of the connecting material C is reduced, and a hollow is thus formed. As illustrated in FIG. 14B, the connecting material C thus formed comes into contact with the second conductive layer L2 and the second basement 20 in the first hole VA, and comes into contact with the light-shielding layer BM, the overcoat layer OC, the seal SE, and the second insulating layer 12, respectively, in the third hole VC, comes into contact with the first conductive layer L1 in the second hole VB, and comes into contact with the first basement 10 in the concavity CC.

Subsequently, as illustrated in FIG. 15A and FIG. 15B, the hollow is filled with the filling material FI. The filling material FI is formed of the same material as the protective film PF, for example. In the example illustrated in FIG. 15A, the filling material FI is filled in the hollow, and at the same time, covers a part of the connector CN of the detection electrode Rx, besides the first and second elongated protrusions R1 and R2 and the first connection portion CR1.

The filling material FI spreads along the inner surface WLS of the wall portions WL1, WL2, and WL3. For this reason, it is possible to prevent the filling material FI from spreading outwardly of the inner surface WLS of the wall portions WL1, WL2, and WL3. The filling material FI is formed to have approximately the same thickness as the protective film PF due to the wall portions WL1, WL2, and WL3. By doing so, the surface of the second substrate SUB2 is substantially planarized, and a difference in level of the portion overlaying the contact hole V can be alleviated.

Thereafter, if the first polarizer PL1 adheres to the first basement 10 and the second polarizer PL2 adheres to the protective film PF, the display device DSP illustrated in FIG. 5 can be obtained. The above-mentioned second polarizer PL2 is extended even to a portion overlaying the contact hole V. Since the difference in level caused by the contact hole V is alleviated by the protective film PF, it is possible to suppress the second polarizer PL2 from being peeled due to a difference in level of a base portion of the second polarizer PL2 at the time of the adhesion of the second polarizer PL2.

According to the display device DSP described above, the detection electrode Rx provided on the second substrate SUB2 is connected to the pad P provided on the first substrate SUB1 by the connecting material C provided in the contact hole V. For this reason, there is no need to mount the wiring substrate for connecting between the detection electrode Rx and the detection circuit RC on the second substrate SUB2. In other words, the wiring substrate SUB3 mounted on the first substrate SUB1 forms a transmission path for transmitting a signal necessary for displaying an image on the display panel PNL, and at the same time, forms a transmission path for transmitting a signal between the detection electrode Rx and the detection circuit RC.

Therefore, the number of wiring substrates can be reduced and the cost can be reduced, as compared with the configuration example requiring a separate wiring substrate in addition to the wiring substrate SUB3. In addition, since a space for connecting the wiring substrate to the second substrate SUB2 is unnecessary, a width of a non-display area of the display panel PNL, in particular, a side edge on which the wiring substrate SUB3 is mounted can be reduced. Therefore, it is possible to narrow the frame and reduce the cost.

The second conductive layer L2 according to the present embodiment has a first elongated protrusion R1 surrounding the first hole VA in the terminal RT. Since the connecting material C injected into the first hole VA spreads along the inner circumferential surface R11 of the first elongated protrusion R1 due to surface tension, it is possible to suppress the connecting material C from spreading outwardly of the first elongated protrusion R1.

Furthermore, the second conductive layer L2 has the second elongated protrusion R2 surrounding the first elongated protrusion R1. Even if an excessive amount of connecting material C is injected into the first hole VA, the connecting material C overflowing from the first elongated protrusion R1 spreads along the inner circumferential surface R21 of the second elongated protrusion R2 due to the surface tension. For this reason, it is possible to prevent the overflowing connecting material C from spreading outwardly of the second elongated protrusion R2.

At this point, the overflowing connecting material C comes into contact with not only the inner circumferential surface R11 or the upper surface R12 of the first elongated protrusion R1 but also the outer circumferential surface R13 of the first elongated protrusion R1 and the inner circumferential surface R21 of the second elongated protrusion R2 in a wrap around manner. By doing so, the contact area with the connecting material C is expanded, such that a resistance value between the connecting material C and the second conductive layer L2 can be stabilized.

Furthermore, the second conductive layer L2 has the projecting portion ER closer to the first hole VA than first elongated protrusion R1. In the example illustrated in FIG. 6, the distal end ER1 of the projecting portion ER reaches the edge of the first hole VA. Even in the case where the first elongated protrusion R1 cannot sufficiently secure the contact area with the connecting material C due to insufficiency of the connecting material C injected into the first hole VA, the projecting portion ER can come into contact with the connecting material C. According to the present embodiment, it is possible to secure the connection reliability between the connecting material C and the first elongated protrusion R1 via the projecting portion ER.

Between the first hole VA and the first elongated protrusion R1, the second main surface 20B of the second basement 20 is exposed from the second conductive layer L2 except for the portion covered with the projecting portion ER. When the first hole VA is formed, the laser light LSR is irradiated to the area where the second conductive layer L2 is not formed. Even when the laser light LSR is irradiated, the first elongated protrusion R1 is not heated directly.

Although the second conductive layer L2 and the second basement 20 differ in expansion and contraction due to a change in temperature, according to the present embodiment, the load applied to the second basement 20 can be suppressed to the minimum to form the first hole VA. Alternatively, if a melting point of the second conductive layer L2 is much higher than that of the second basement 20, it is conceivable that the second basement 20 is excessively heated and scattered. According to the present embodiment, the scattering of the second basement 20 can be prevented.

The second conductive layer L2 has wall portions WL1, WL2, and WL3 disposed outside the first elongated protrusion R1 and the second elongated protrusion R2. When the filling material FI covering the surface of the connecting material C is filled, the filling material FI spreads along the inner surface WLS of the wall portions WL1, WL2, and WL3, such that it is possible to prevent the filling material FI from spreading outwardly of the inner surface WLS of the wall portions WL1, WL2, and WL3. In addition, it is possible to suppress variations in a thickness of the filling material FI with respect to a filling content of the filling material FI and alleviate a difference in level in the third direction Z at the terminal RT.

Next, the second to fourth embodiments will be described. It should be noted that the components having the same or similar functions as those of the first embodiment are denoted by the same reference numerals and the description thereof will be omitted by taking into consideration of the description of the first embodiment. In addition, configurations other than those to be described below are the same as the first embodiment.

Second Embodiment

A second conductive layer L2 according to a second embodiment will be described with reference to FIG. 16. The second embodiment is different from the first embodiment in that a terminal RT includes a third elongated protrusion R3 as illustrated in FIG. 14.

The third elongated protrusion R3 is formed in an annular shape surrounding first and second elongated protrusions R1 and R2. It can be said that the third elongated protrusion R3 is disposed outside the first and second elongated protrusions R1 and R2 when viewed from a first hole VA. The second elongated protrusion R2 and the third elongated protrusion R3 are connected to each other by a second connection portion CR2. The number of second connection portions CR2 may be one or two or more. In the example illustrated in FIG. 16, eight second connection portions CR2 are provided at regular intervals.

As illustrated in FIG. 16, an extending direction of the first connection portion CR1 and an extending direction of the second connection portion CR2 are different from each other when viewed from the first hole VA. In other words, the first connection portion CR1 and the second connection portion CR2 are disposed to be spaced apart from each other in a circumferential direction of the first hole VA.

In the example illustrated in FIG. 16, the connector CN has a slit CSL formed in an arc shape along the third elongated protrusion R3. When a protective film PL is applied to cover the second conductive layer L2, the protective film PL spreads along an outer edge E1 of the slit CSL, such that it is possible to prevent the protective film PL from spreading inwardly of the outer edge E1. When the filling material FI is filled to cover the connecting material C, since the filling material FI spreads along an inner edge E2 of the slit CSL, it is possible to prevent the filling material FI from spreading outwardly of the inner edge E2.

The second conductive layer L2 according to the second embodiment has the third elongated protrusion R3 further surrounding the second elongated protrusion R2. For this reason, even if the connecting material C of an amount overflowing from the second elongated protrusion R2 is injected, it is possible to prevent the connecting material C from spreading outwardly of the third elongated protrusion R3.

The first connection portion CR1 and the second connection portion CR2 are spaced apart from each other not to be disposed on the same straight line. For this reason, the connecting material C extended along the first connection portion CR1 cannot spread up to the second connection portion CR2 unless it passes through the second elongated protrusion R2. Since a path toward the third elongated protrusion R3 becomes long, it is possible to more reliably prevent the connecting material C from spreading outwardly of the third elongated protrusion R3. In addition, since the second elongated protrusion R2 and the third elongated protrusion R3 can be reliably connected to each other by the plurality of second connection portions CR2, it is possible to improve connection reliability between the first elongated protrusion R1 and the connector CN of a detection electrode Rx, as compared with a third embodiment to be described below.

Third Embodiment

A second conductive layer L2 according to a third embodiment will be described with reference to FIG. 17. As illustrated in FIG. 17, the third embodiment is different from the above-mentioned second embodiment in that a first connection portion CR1 and a second connection portion CR2 each are only one. The first connection portion CR1 and the second connection portion CR2 are spaced apart from each other in a circumferential direction of a first hole VA not to be disposed on the same straight line.

In the third embodiment, a slit RSL1 between a first elongated protrusion R1 and a second elongated protrusion R2 is not divided by a plurality of first connection portions CR1. The slit RSL1 is extended over substantially the entire circumference except for a portion covered with one first connection portion CR1. Likewise, a slit RSL2 between the first elongated protrusion R1 and the second elongated protrusion R2 also is extended over substantially the entire circumference.

According to the third embodiment, like the second embodiment, it is possible to prevent a connecting material C from spreading outwardly of a third elongated protrusion R3. In addition, since the slits RSL1 and RSL2 are larger than in the second embodiment, a large amount of connecting material C can be stored. For this reason, even when the connecting material C is biased toward one side of the first elongated protrusion R1, the connecting material C can be spread to the other side, which is an opposite side to one side, along the second elongated protrusion R2.

Fourth Embodiment

A terminal RT according to a fourth embodiment will be described with reference to FIG. 18. As illustrated in FIG. 18, the fourth embodiment is different from the first embodiment in that a first elongated protrusion R1 is not formed in an annular shape. For this reason, the first elongated protrusion R1 according to the fourth embodiment has a first portion R1A close to the first hole VA and a second portion R1B close to the second elongated protrusion R2.

In the example illustrated in FIG. 18, the first elongated protrusion R1 has a plurality (for example, four) of arc-shaped elongated protrusions R4. Edge portions of each elongated protrusion R4 are connected to each other. The edge portion corresponds to the first portion R1A. It should be noted that a shape of the first elongated protrusion R1 is not limited thereto. Although not illustrated, the first elongated protrusion R1 may have a star shape in which it alternately and linearly approximates between the first hole VA and the second elongated protrusion R2 while being bent, or may also have a wave shape alternately and curvi-linearly approximating between the first hole VA and the second elongated protrusion R2. In short, the first elongated protrusion R1 has a closed annular shape surrounding the first hole VA and preferably has the first portion R1A close to the first hole VA and the second portion R1B close to the second elongated protrusion R2.

In the fourth embodiment, in the second portion R1B, the first elongated protrusion R1 overlays the second elongated protrusion R2. For this reason, the connection reliability between the first elongated protrusion R1 and the second elongated protrusion R2 can be secured. In addition, in the first portion R1A, since the first elongated protrusion R1 is close to the first hole VA, the connection reliability between the connecting material C and the first elongated protrusion R1 can be secured. For this reason, the first connection portion CR1 or the projecting portion ER in the first embodiment can be omitted.

As described above, according to each embodiment, it is possible to provide an electronic apparatus capable of narrowing the frame and reducing cost, and a method for manufacturing the same.

It should be noted that change of design may be arbitrarily added to the present invention, based on the display device described as one of the embodiments. The accompanying claims and their equivalents are intended to cover display devices modified as would fall within the scope and spirit of the inventions.

For example, in the second to fourth embodiments illustrated in FIGS. 16 to 18, the wall portions WL1, WL2 and WL3 according to the first embodiment illustrated in FIG. 6 may be provided. Conversely, in the first embodiment, the arc-shaped slit CSL according to the second embodiment may be provided.

What is claimed is:

1. A display device, comprising:
   a first substrate configured to include a first basement and a first conductive layer;
   a second substrate configured to include a second basement that includes a first main surface opposed to the first conductive layer and spaced apart from the first conductive layer and a second main surface opposite to the first main surface and a second conductive layer that is provided on the second main surface, and be provided with a hole penetrating between the first main surface and the second main surface; and
   a connecting material configured to electrically connect between the first conductive layer and the second conductive layer via the hole,
   wherein the second conductive layer includes a first elongated protrusion that is disposed around the hole to surround the hole, and
   the connecting material comes into contact with the first elongated protrusion.

2. The display device of claim 1, wherein the second conductive layer further includes a second elongated protrusion that is disposed outside the first elongated protrusion when viewed from the hole to surround the first elongated protrusion.

3. The display device of claim 1, wherein the second conductive layer further includes an projecting portion that is extended from the first elongated protrusion toward the hole.

4. The display device of claim 1, further comprising:
   a filling material configured to cover the connecting material,
   wherein the second conductive layer further includes a wall portion that is disposed outside the first elongated protrusion when viewed from the hole to surround the first elongated protrusion, and the filling material comes into contact with the wall portion.

5. The display device of claim 1, wherein the second conductive layer further includes an electrode portion that is electrically connected to the first elongated protrusion and a connector that connects between the first elongated protrusion and the electrode portion, and the connector is provided with a slit.

6. The display device of claim 1, wherein the first elongated protrusion is formed in an annular shape extended in a circumferential direction of the hole.

7. The display device of claim 2, wherein the second conductive layer further includes a first connection portion that connects between the first elongated protrusion and the second elongated protrusion.

8. The display device of claim 2, wherein the first elongated protrusion has a width larger than that of the second elongated protrusion.

9. The display device of claim 2, wherein the second elongated protrusion is opposed to the first elongated protrusion at a predetermined interval.

10. The display device of claim 2, wherein the second conductive layer further includes an projecting portion that is extended from the first elongated protrusion toward the hole.

11. The display device of claim 2, further comprising:
a filling material configured to cover the connecting material,
wherein the second conductive layer further includes a wall portion that is disposed outside the first elongated protrusion when viewed from the hole to surround the first elongated protrusion, and
the filling material comes into contact with the wall portion.

12. The display device of claim 2, wherein the first elongated protrusion is formed in an annular shape extended in a circumferential direction of the hole.

13. The display device of claim 3, further comprising:
a filling material configured to cover the connecting material,
wherein the second conductive layer further includes a wall portion that is disposed outside the first elongated protrusion when viewed from the hole to surround the first elongated protrusion, and
the filling material comes into contact with the wall portion.

14. The display device of claim 3, wherein the first elongated protrusion is formed in an annular shape extended in a circumferential direction of the hole.

15. The display device of claim 4, wherein the first elongated protrusion is formed in an annular shape extended in a circumferential direction of the hole.

16. The display device of claim 4, wherein the wall portion includes an inner surface opposed to the hole at a predetermined interval.

17. The display device of claim 5, wherein the first elongated protrusion is formed in an annular shape extended in a circumferential direction of the hole.

18. The display device of claim 7, wherein the first elongated protrusion is formed in an annular shape extended in a circumferential direction of the hole.

19. The display device of claim 7, wherein the second conductive layer further includes a third elongated protrusion that is disposed outside the second elongated protrusion when viewed from the hole to surround the second elongated protrusion and a second connection portion that connects between the second elongated protrusion and the third elongated protrusion, and
an extending direction of the first connection portion and an extending direction of the second connection portion are different from each other when viewed from the hole.

20. An inter-substrate conducting structure electrically connecting between a first conductive layer provided on a first substrate and a second conductive layer provided on a second substrate by a connecting material, wherein
the first substrate includes a first basement and a first conductive layer provided on the first basement,
a second substrate includes a second basement that includes a first main surface opposed to the first conductive layer and spaced apart from the first conductive layer and a second main surface opposite to the first main surface and a second conductive layer that is provided on the second main surface, and is provided with a hole penetrating between the first main surface and the second main surface;
the second conductive layer includes a first elongated protrusion that is disposed around the hole to surround the hole, and
the connecting material comes into contact with the first elongated protrusion and the first conductive layer via the hole.

* * * * *